US010461693B2

(12) United States Patent
Fukuzawa

(10) Patent No.: US 10,461,693 B2
(45) Date of Patent: Oct. 29, 2019

(54) CIRCUIT DEVICE, OSCILLATOR, ELECTRONIC APPARATUS, AND MOVING OBJECT

(71) Applicant: Seiko Epson Corporation, Tokyo (JP)

(72) Inventor: Akihiro Fukuzawa, Hino (JP)

(73) Assignee: Seiko Epson Corporation (JP)

( * ) Notice: Subject to any disclaimer, the term of this patent is extended or adjusted under 35 U.S.C. 154(b) by 262 days.

(21) Appl. No.: 15/345,682

(22) Filed: Nov. 8, 2016

(65) Prior Publication Data

US 2017/0141727 A1    May 18, 2017

(30) Foreign Application Priority Data

Nov. 12, 2015 (JP) .................. 2015-221730

(51) Int. Cl.

| G01N 27/00 | (2006.01) |
| G08B 19/00 | (2006.01) |
| G08B 21/00 | (2006.01) |
| G01J 5/00 | (2006.01) |
| G01K 7/00 | (2006.01) |
| G05D 23/20 | (2006.01) |
| G08B 13/18 | (2006.01) |
| G08B 27/00 | (2006.01) |
| H03B 5/04 | (2006.01) |
| H03B 5/36 | (2006.01) |

(Continued)

(52) U.S. Cl.
CPC .............. *H03B 5/04* (2013.01); *H03B 5/368* (2013.01); *H03L 1/00* (2013.01); *H03L 1/023* (2013.01); *H03L 1/028* (2013.01); *H03B 2200/0088* (2013.01)

(58) Field of Classification Search
CPC .. H03B 5/04; H03B 5/368; H03B 2200/0088; H03L 1/028; H03L 1/00; H03L 1/023
USPC ....................... 331/66, 69, 70, 176
See application file for complete search history.

(56) References Cited

U.S. PATENT DOCUMENTS 5,081,431 A * 1/1992 Kubo ................. H03L 1/026
                                                331/116 R
5,912,595 A * 6/1999 Ma .................... H03L 1/025
                                                331/117 D (Continued)

FOREIGN PATENT DOCUMENTS

| JP | 64-082809 A | 3/1989 |
| JP | 2012-199631 A | 10/2012 |

*Primary Examiner* — Richard Tan
(74) *Attorney, Agent, or Firm* — Harness, Dickey & Pierce, P.L.C.

(57) ABSTRACT

A circuit device includes an A/D conversion unit, a processing unit that performs a temperature compensation process of an oscillation frequency based on temperature detection data and outputs frequency control data of the oscillation frequency, a D/A conversion unit, and an oscillation circuit. The D/A conversion unit (area DAC) is disposed on a first direction DR1 side of the A/D conversion unit (area ADC). When a direction crossing the first direction DR1 is defined as a second direction DR2, the processing unit (area DSPL) is disposed on the second direction DR2 side of the A/D conversion unit and the D/A conversion unit. When a direction opposite to the second direction DR2 is defined as a third direction DR3, the oscillation circuit (area OSC) is disposed on the third direction DR3 side or the first direction DR1 side of the D/A conversion unit.

19 Claims, 16 Drawing Sheets

(51) Int. Cl.
*H03L 1/00* (2006.01)
*H03L 1/02* (2006.01)

(56) References Cited

U.S. PATENT DOCUMENTS

| | | | | |
|---|---|---|---|---|
| 6,661,302 B1* | 12/2003 | Rathore | ............... | H03L 1/023 |
| | | | | 331/158 |
| 7,215,214 B1* | 5/2007 | Taheri | ............... | H03B 5/04 |
| | | | | 310/315 |
| 7,371,005 B1* | 5/2008 | Ahuja | ............... | G04F 5/06 |
| | | | | 331/176 |
| 7,616,074 B2* | 11/2009 | Toffolon | ............... | H03L 3/00 |
| | | | | 331/185 |
| 2001/0048349 A1* | 12/2001 | Matsumoto | ............... | H03B 5/04 |
| | | | | 331/25 |
| 2006/0214740 A1* | 9/2006 | Sheng | ............... | H03B 5/364 |
| | | | | 331/158 |
| 2008/0042769 A1* | 2/2008 | Berens | ............... | H03B 5/364 |
| | | | | 331/185 |
| 2009/0160569 A1* | 6/2009 | Gros | ............... | G04G 3/02 |
| | | | | 331/176 |
| 2012/0176763 A1* | 7/2012 | Asamura | ............... | H03B 5/364 |
| | | | | 361/820 |
| 2013/0082791 A1* | 4/2013 | Murata | ............... | G05F 1/567 |
| | | | | 331/158 |
| 2014/0091867 A1* | 4/2014 | Nonoyama | ............... | H03L 1/023 |
| | | | | 331/70 |
| 2014/0292423 A1* | 10/2014 | Isohata | ............... | H03L 1/025 |
| | | | | 331/70 |

\* cited by examiner

CIRCUIT DEVICE, OSCILLATOR, ELECTRONIC APPARATUS, AND MOVING OBJECT

BACKGROUND

1. Technical Field

The present invention relates to a circuit device, an oscillator, an electronic apparatus, a moving object, and the like.

2. Related Art

A temperature compensated oscillator, called the temperature compensated crystal oscillator (TCXO), is known in the related art. The TCXO is used as a reference signal source or the like in, for example, a mobile communication terminal, a GPS-related apparatus, a wearable apparatus, or a vehicle-mounted apparatus.

The TCXO includes an ATCXO, which is an analog temperature compensated oscillator, and a DTCXO, which is a digital temperature compensated oscillator. As a related-art ATCXO, one disclosed in JP-A-2012-199631 is known. As a related-art DTCXO, one disclosed in JP-A-64-82809 is known.

A digital oscillator such as the DTCXO includes a processing unit that performs temperature compensation through digital signal processing. In the oscillator, noise caused by the digital signal processing of the processing unit propagates to an oscillation circuit through, for example, a substrate or the like, and thus the oscillator has a problem in that the noise adversely influences characteristics (e.g., phase noise characteristics, etc.) of an oscillation signal.

Moreover, an efficient layout in which the influence of the noise caused by the digital signal processing is reduced and which takes into account a connection relationship between circuits is desired.

SUMMARY

An advantage of some aspects of the invention is to provide a circuit device capable of reducing the influence of noise caused by digital signal processing of a processing unit in a digital oscillator such as the DTCXO, an oscillator, an electronic apparatus, a moving object, and the like.

An aspect of the invention relates to a circuit device including: an A/D conversion unit that performs A/D conversion of a temperature detection voltage from a temperature sensor unit and outputs temperature detection data; a processing unit that performs a temperature compensation process of an oscillation frequency based on the temperature detection data and outputs frequency control data of the oscillation frequency; and an oscillation signal generating circuit that generates, using the frequency control data from the processing unit and a resonator, an oscillation signal at the oscillation frequency set by the frequency control data, wherein the oscillation signal generating circuit includes a D/A conversion unit that performs D/A conversion of the frequency control data from the processing unit, and an oscillation circuit that generates the oscillation signal using an output voltage of the D/A conversion unit and the resonator, the D/A conversion unit is disposed on a first direction side of the A/D conversion unit, when a direction crossing the first direction is defined as a second direction, the processing unit is disposed on the second direction side of the A/D conversion unit and the D/A conversion unit, and when a direction opposite to the second direction is defined as a third direction, the oscillation circuit is disposed on the third direction side or the first direction side of the D/A conversion unit.

According to the aspect of the invention, the oscillation circuit is disposed on the third direction side of the D/A conversion unit, and the processing unit is disposed on the second direction side of the D/A conversion unit. In this case, since the third direction and the second direction are opposite to each other, the oscillation circuit and the processing unit can be disposed with the D/A conversion unit therebetween. Alternatively, the oscillation circuit is disposed on the first direction side of the D/A conversion unit, and the processing unit is disposed on the second direction side of the D/A conversion unit. That is, as viewed from the D/A conversion unit, the oscillation circuit and the processing unit can be disposed in the first direction and the second direction crossing each other. With these configurations, the oscillation circuit and the processing unit can be disposed separate from each other, and thus the influence of noise caused by digital signal processing of the processing unit can be reduced in a digital oscillator such as the DTCXO.

In one aspect of the invention, the circuit device may further include a memory unit that stores coefficient data (gain coefficient data) of an approximate Nth-order function of the temperature compensation process and supplies the coefficient data to the processing unit, and the memory unit may be disposed on the second direction side of the processing unit.

According to the aspect of the invention, the D/A conversion unit is disposed on the first direction side of the A/D conversion unit, and the processing unit is disposed on the second direction side of the A/D conversion unit and the D/A conversion unit. That is, the D/A conversion unit and the A/D conversion unit, the processing unit, and the memory unit are disposed in this order in the second direction. With this configuration, wiring lines can be efficiently routed between the D/A conversion unit and the A/D conversion unit, and the processing unit, and between the memory unit and the processing unit. Moreover, since the routing of digital signal wiring lines is reduced, noise spread from the digital signal wiring lines is reduced, and thus the characteristics of the oscillation signal can be improved in a digital oscillator such as the DTCXO.

In one aspect of the invention, the processing unit and the memory unit may be disposed such that long-side directions thereof are along the first direction.

According to the aspect of the invention, the memory unit is disposed on the second direction side of the processing unit, and the long-side directions of the processing unit and the memory unit are along the first direction, so that the long-side directions of the processing unit and the memory unit are the same as each other. Since the coefficient data of the approximate Nth-order function of the temperature compensation process is supplied from the memory unit to the processing unit, a number of signal lines for the coefficient data can be routed between the long sides opposed to each other.

In one aspect of the invention, the circuit device may further include a buffer circuit that buffers the oscillation signal of the oscillation circuit, and when a direction opposite to the first direction is defined as a fourth direction and the oscillation circuit is disposed on the third direction side of the D/A conversion unit, the buffer circuit may be disposed on the fourth direction side of the oscillation circuit.

According to the aspect of the invention, as viewed from the oscillation circuit, the D/A conversion unit and the buffer circuit can be disposed in the third direction and the fourth direction crossing each other. With this configuration, the buffer circuit can be efficiently disposed while maintaining the positional relationship among the oscillation circuit, the D/A conversion unit, and the processing unit to address noise.

In one aspect of the invention, the circuit device may further include a buffer circuit that buffers the oscillation signal of the oscillation circuit, and when the oscillation circuit is disposed on the first direction side of the D/A conversion unit, the buffer circuit may be disposed on the second direction side of the oscillation circuit.

According to the aspect of the invention, as viewed from the oscillation circuit, the D/A conversion unit and the buffer circuit can be disposed in the first direction and the second direction crossing each other. Also with this configuration, the buffer circuit can be efficiently disposed while maintaining the positional relationship among the oscillation circuit, the D/A conversion unit, and the processing unit to address noise.

In one aspect of the invention, the oscillation circuit may be disposed adjacent to the D/A conversion unit on the third direction side or the first direction side thereof.

According to the aspect of the invention, since the oscillation circuit and the D/A conversion unit are disposed adjacent to each other, a frequency control voltage from the D/A conversion unit can be input to the oscillation circuit through a short wiring line. With this configuration, disturbance (noise) to the frequency control voltage influencing the characteristics of the oscillation signal can be reduced.

In one aspect of the invention, the circuit device may further include at least one reference voltage generating circuit that is supplied with an external power supply and generates a reference voltage generated based on a work function difference of a transistor, and the at least one reference voltage generating circuit may be disposed in a pad area where a pad is disposed.

According to the aspect of the invention, the reference voltage is generated based on the work function difference of the transistor. With this configuration, the reference voltage can be supplied as a power supply voltage to the A/D conversion unit, the processing unit, the D/A conversion unit, and the oscillation circuit. The reference voltage is generated based on the work function difference of the transistor, so that it is possible to maintain a high PSRR while reducing a consumption current, compared with the case where, for example, a bandgap reference circuit is used. With this configuration, it is possible to realize a digital oscillator such as the DTCXO capable of reducing power consumption of a power supply.

In one aspect of the invention, the circuit device may include, as the at least one reference voltage generating circuit, at least one of a first reference voltage generating circuit that supplies a first reference voltage generated based on the work function difference as a first power supply voltage to the A/D conversion unit, a second reference voltage generating circuit that supplies a second reference voltage generated based on the work function difference as a second power supply voltage to the processing unit, and a third reference voltage generating circuit that supplies a third reference voltage generated based on the work function difference as a third power supply voltage to the D/A conversion unit.

According to the aspect of the invention, at least one reference voltage generating circuit of the first reference voltage generating circuit, the second reference voltage generating circuit, and the third reference voltage generating circuit respectively corresponding to the A/D conversion unit, the processing unit, and the D/A conversion unit is provided. With this configuration, since power supply lines of the units can be separated from each other, it is possible to inhibit the propagation of noise through the power supply lines and improve the accuracy (e.g., phase noise characteristics) of the oscillation signal. Moreover, in an aspect of the invention, since a digital temperature compensated oscillation circuit performs temperature compensation, it is possible to perform temperature compensation including the influence of the temperature characteristics of the power supply on the temperature characteristics of the oscillation frequency.

In one aspect of the invention, the circuit device may further include a reference current generating circuit that generates a reference current based on the reference voltage, and the oscillation circuit may cause the resonator to oscillate with a drive current based on the reference current.

According to the aspect of the invention, the reference current generating circuit is provided corresponding to the oscillation circuit. With this configuration, since the oscillation circuit can be separated from the power supply lines of the other circuits such as the processing unit, it is possible to inhibit the propagation of noise through the power supply lines and improve the accuracy (e.g., phase noise characteristics) of the oscillation signal. Moreover, in the aspect of the invention, since a digital temperature compensated oscillation circuit performs temperature compensation, it is possible to perform temperature compensation including the influence of the temperature characteristics of the power supply on the temperature characteristics of the oscillation frequency.

In one aspect of the invention, the circuit device may further include: an output terminal that outputs a signal based on the oscillation signal of the oscillation circuit; a first terminal for the resonator and a second terminal for the resonator that are connected with the resonator; a first power supply terminal and a second power supply terminal that are supplied with a power supply voltage; and an enable terminal, the output terminal, the first terminal for the resonator, and the first power supply terminal may be disposed in a first pad area along a first side of the circuit device, the second power supply terminal, the second terminal for the resonator, and the enable terminal may be disposed in a second pad area along a second side of the circuit device opposed to the first side, and long-side directions of the first pad area and the second pad area may be the third direction or the first direction.

By doing this, the first pad area and the second pad area are provided at the first side and the second side opposed thereto, and the oscillation circuit, the D/A conversion unit, the A/D conversion unit, or the processing unit can be disposed between the first pad area and the second pad area.

Another aspect of the invention relates to an oscillator including the circuit device according to any of the aspects and the resonator.

Still another aspect of the invention relates to an electronic apparatus including the circuit device according to any of the aspects.

Yet another aspect of the invention relates to a moving object including the circuit device according to any of the aspects.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a preferred embodiment of the invention will be described in detail. The embodiment described below does not unduly limit the contents of the invention set forth in the appended claims, and not all of the configurations described in the embodiment may necessarily be indispensable as solving means of the invention.

1. Configuration

Figure 1:
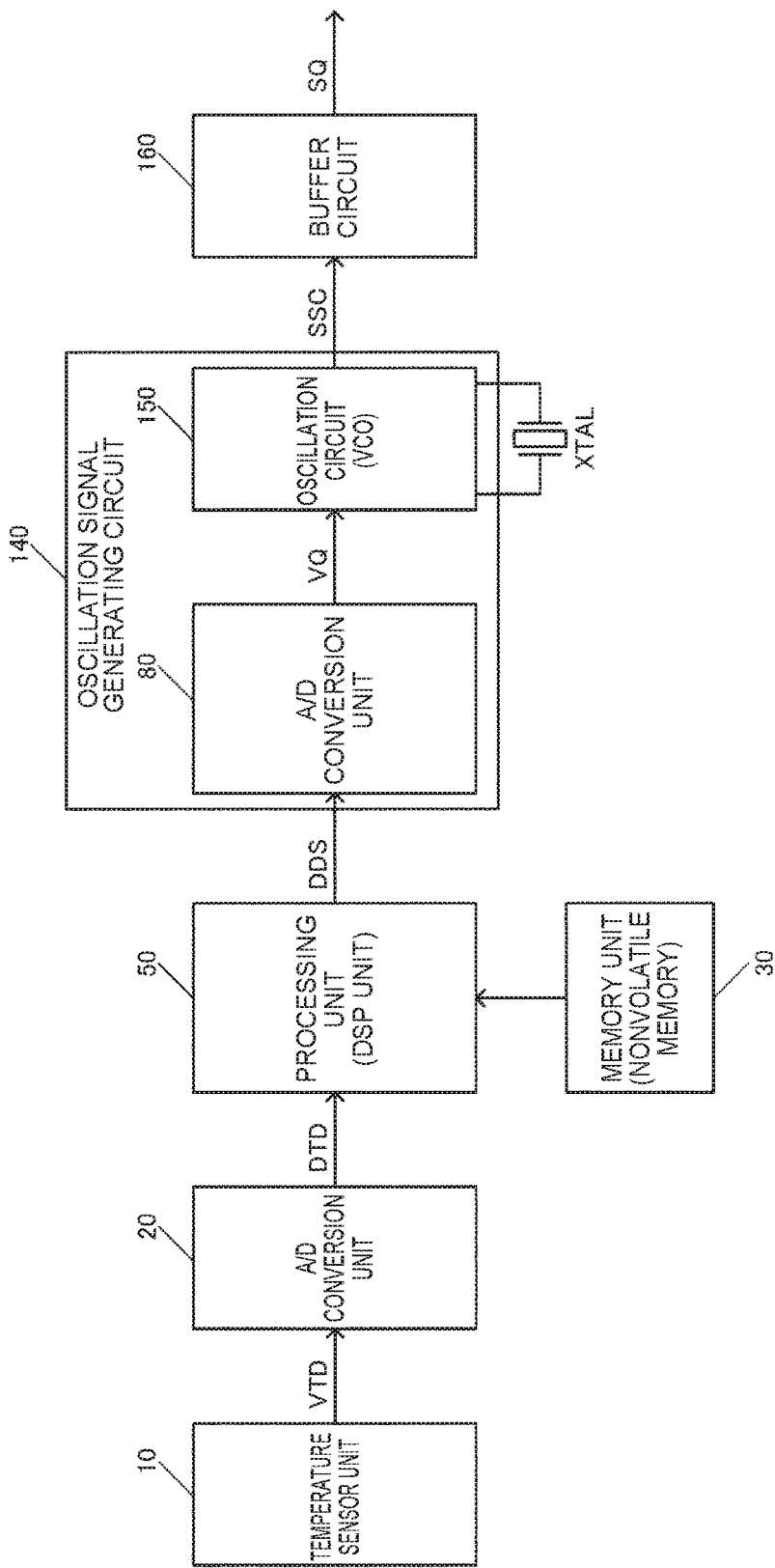
FIG. 1 shows a configuration example of a circuit device.

FIG. 1 shows a basic configuration example of a circuit device of an embodiment. This circuit device is a circuit device (semiconductor chip) for realizing a digital oscillator such as a DTCXO or an oven controlled crystal oscillator (OCXO). For example, by accommodating this circuit device and a resonator XTAL in a package, a digital oscillator is realized.

The circuit device in FIG. 1 includes an A/D conversion unit 20, a processing unit 50, and an oscillation signal generating circuit 140. Moreover, the circuit device can include a temperature sensor unit 10, a buffer circuit 160, and a memory unit 30. The configuration of the circuit device is not limited to the configuration in FIG. 1. Various modifications can be implemented, such as omitting a portion of the components (e.g., the temperature sensor unit, the buffer circuit, the A/D conversion unit, etc.) or adding another component.

The resonator XTAL is, for example, a piezoelectric resonator such as a quartz crystal resonator. The resonator XTAL may be an oven controlled resonator (OCXO) provided in a constant-temperature oven. The resonator XTAL may be a resonator (an electromechanical resonator or an electrical resonant circuit). As the resonator XTAL, a piezoelectric resonator, a surface acoustic wave (SAW) resonator, a micro-electro-mechanical-systems (MEMS) resonator, or the like can be employed. Examples of the substrate material of the resonator XTAL can include piezoelectric single crystal such as quartz crystal, lithium tantalate, or lithium niobate, a piezoelectric material such as piezoelectric ceramics including lead zirconate titanate, and a silicon semiconductor material. As exciting means of the resonator XTAL, a piezoelectric effect may be used, or electrostatic driving using the Coulomb force may be used.

The temperature sensor unit 10 outputs a temperature detection voltage VTD. Specifically, the temperature sensor unit 10 outputs a temperature-dependent voltage, which changes depending on the temperature of an environment (the circuit device), as the temperature detection voltage VTD. A specific configuration example of the temperature sensor unit 10 will be described later.

The A/D conversion unit 20 performs A/D conversion of the temperature detection voltage VTD from the temperature sensor unit 10, and outputs temperature detection data DTD. For example, the A/D conversion unit 20 outputs the temperature detection data DTD (A/D result data) in digital form corresponding to the result of A/D conversion of the temperature detection voltage VTD. As the A/D conversion method of the A/D conversion unit 20, for example, a successive approximation method or a method similar to the successive approximation method can be employed. The A/D conversion method is not limited to the methods described above, and various methods (a digital type, a parallel comparison type, a serial-parallel type, etc.) can be employed.

The processing unit 50 (DSP unit: digital signal processing unit) performs various kinds of signal processing. For example, the processing unit 50 (temperature compensation unit) performs a temperature compensation process of an oscillation frequency (the frequency of an oscillation signal) based on the temperature detection data DTD. Then, the processing unit 50 outputs frequency control data DDS of the oscillation frequency. Specifically, the processing unit 50 performs the temperature compensation process based on the temperature detection data DTD (temperature-dependent data) changing depending on the temperature, coefficient data (data of the coefficient of an approximation function) for the temperature compensation process, and the like, for keeping the oscillation frequency constant even when the temperature changes. The processing unit 50 may be realized by an ASIC circuit such as a gate array, or may be realized by a processor (e.g., a CPU, a MPU, etc.) and programs running on the processor.

The oscillation signal generating circuit 140 generates an oscillation signal SSC. For example, the oscillation signal generating circuit 140 generates, using the frequency control data DDS from the processing unit 50 and the resonator XTAL, the oscillation signal SSC at an oscillation frequency set by the frequency control data DDS. As one example, the oscillation signal generating circuit 140 causes the resonator XTAL to oscillate at the oscillation frequency set by the frequency control data DDS to generate the oscillation signal SSC.

The oscillation signal generating circuit 140 may be a circuit that generates the oscillation signal SSC by a direct digital synthesizer method. For example, the oscillation signal SSC at the oscillation frequency set by the frequency control data DDS may be digitally generated using the oscillation signal of the resonator XTAL (an oscillation source of a fixed oscillation frequency) as a reference signal.

The oscillation signal generating circuit 140 can include a D/A conversion unit 80 and an oscillation circuit 150. However, the oscillation signal generating circuit 140 is not limited to the configuration described above. Various modifications can be implemented, such as omitting a portion of the components or adding another component.

The D/A conversion unit 80 performs D/A conversion of the frequency control data DDS (the output data of the processing unit) from the processing unit 50. The frequency control data DDS input to the D/A conversion unit 80 is frequency control data (frequency control code) after being subjected to the temperature compensation process performed by the processing unit 50. As the D/A conversion method of the D/A conversion unit 80, for example, a resistor-string type (resistor divider type) can be employed. However, the D/A conversion method is not limited to this, and various methods such as a resistor-ladder type (R-2R ladder type, etc.), a capacitive array type, or a pulse-width modulation type can be employed. Moreover, the D/A conversion unit 80 can include, in addition to a D/A converter, a control circuit therefor, a modulation circuit, and a filter circuit.

The oscillation circuit 150 generates the oscillation signal SSC using an output voltage VQ of the D/A conversion unit 80 and the resonator XTAL. The oscillation circuit 150 is connected to the resonator XTAL through first and second terminals for the resonator (pads for the resonator). For example, the oscillation circuit 150 causes the resonator XTAL (a piezoelectric resonator, a resonator, etc.) to oscillate to thereby generate the oscillation signal SSC. Specifically, the oscillation circuit 150 causes the resonator XTAL to oscillate at an oscillation frequency set based on the output voltage VQ of the D/A conversion unit 80 as a frequency control voltage (oscillation control voltage). For example, when the oscillation circuit 150 is a circuit (VCO) that controls the oscillation of the resonator XTAL through voltage control, the oscillation circuit 150 can include a variable capacitance capacitor (a varicap, etc.) whose capacitance value changes depending on the frequency control voltage.

The buffer circuit 160 buffers the oscillation signal SSC generated by the oscillation signal generating circuit 140 (the oscillation circuit 150), and outputs a buffered signal SQ. That is, the buffer circuit 160 buffers the signal so that an external load can be sufficiently driven. The signal SQ is, for example, a clipped sine wave signal. However, the signal SQ may be a rectangular wave signal. Alternatively, the buffer circuit 160 may be a circuit that can output, as the signal SQ, both a clipped sine wave signal and a rectangular wave signal.

The memory unit 30 stores the coefficients of a polynomial for compensating for the temperature characteristics of the oscillation frequency. For example, the temperature characteristics of the oscillation frequency are measured using a test device in an inspection or the like of an oscillator before shipment, the test device obtains the coefficients of a polynomial based on the measured temperature characteristics, and the test device writes the coefficients into the memory unit 30. The polynomial is used to associate the temperature detection data DTD (the output data of the A/D conversion unit 20) with the frequency control data DDS (the input data of the D/A conversion unit 80). The memory unit 30 is, for example, a nonvolatile memory such as an electrically erasable programmable read-only memory (EEPROM). Alternatively, the memory unit 30 may be a random access memory (RAM) or a register. The processing unit 50 reads the coefficient from the memory unit 30, substitutes the temperature detection data DTD into the polynomial to which the coefficient is applied, generates the frequency control data DDS based on the operation result of the polynomial, and outputs the frequency control data DDS to the D/A conversion unit 80.

2. Layout

Figure 2:
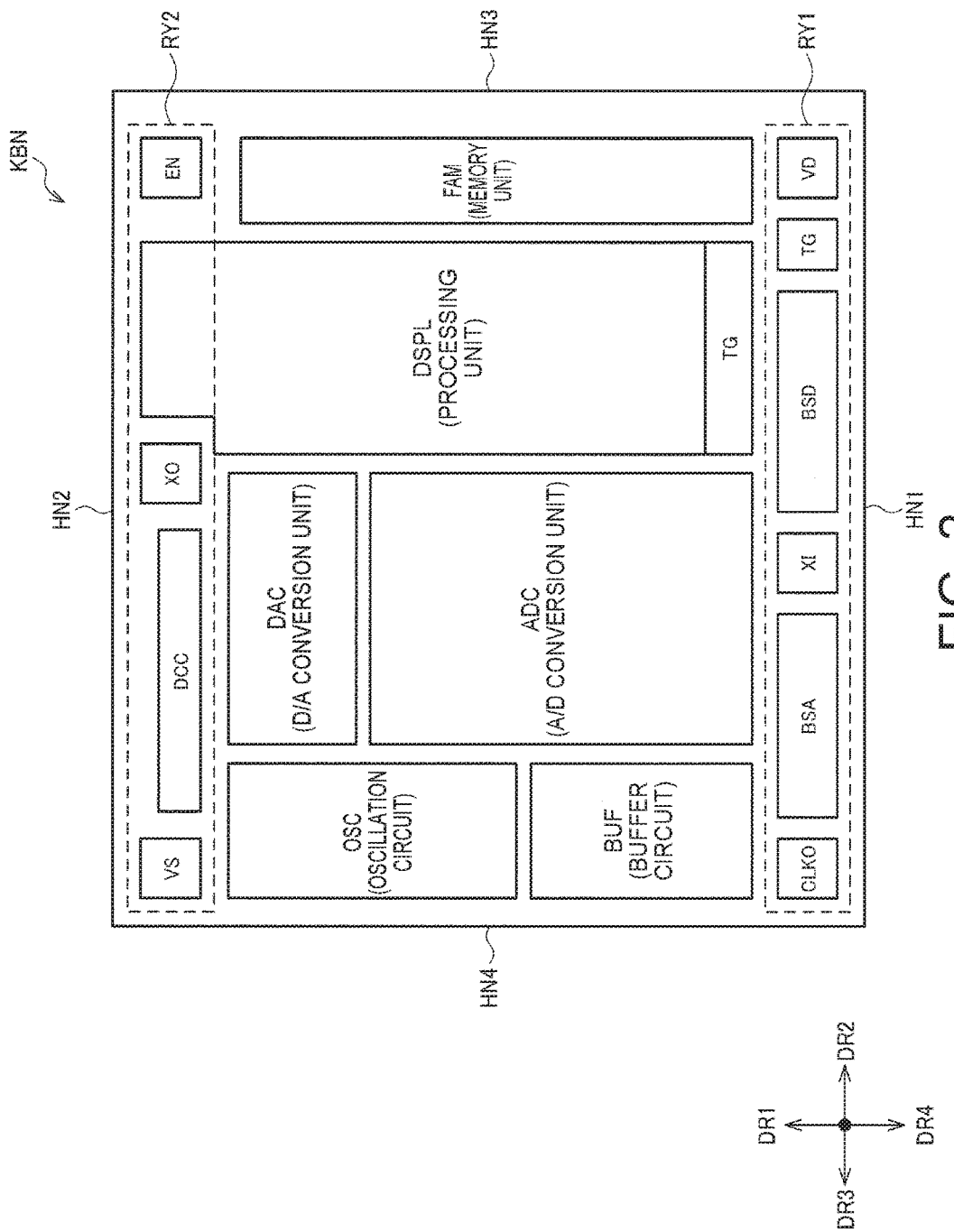
FIG. 2 shows a first layout configuration example of the circuit device.
Figure 3:
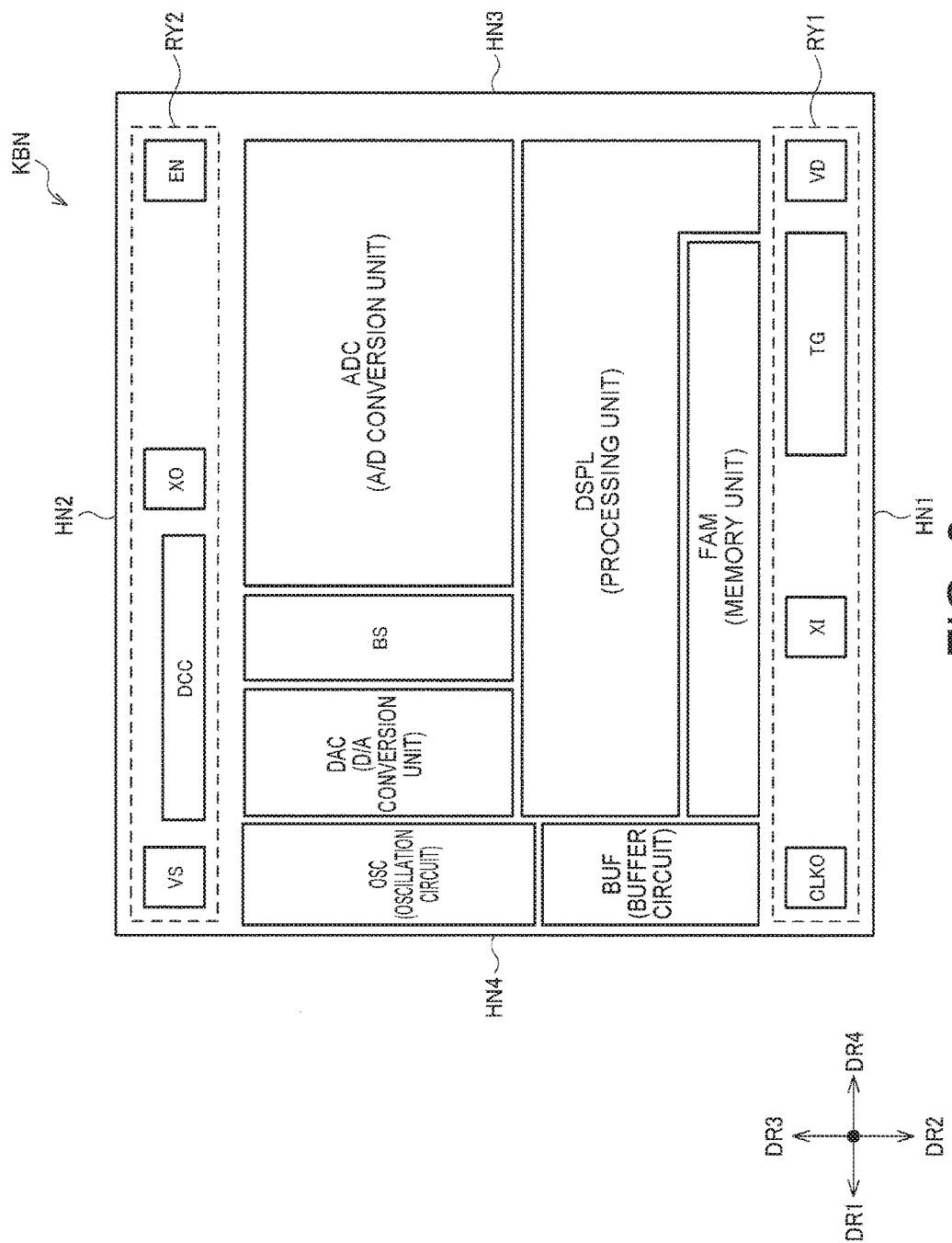
FIG. 3 shows a second layout configuration example of the circuit device.

FIG. 2 shows a first layout configuration example of the circuit device of the embodiment. FIG. 3 shows a second layout configuration example of the circuit device of the embodiment. FIGS. 2 and 3 are plan views of a substrate KBN (a semiconductor substrate or a silicon substrate) of the circuit device as viewed in the thickness direction. The layout configuration of the circuit device is not limited to the configurations in FIGS. 2 and 3. For example, an area that is described as a rectangular area in the following may not be necessarily rectangular.

First, the first layout configuration example in FIG. 2 will be described.

The substrate KBN is provided with an area OSC where the oscillation circuit 150 is disposed, an area BUF where the buffer circuit 160 is disposed, an area DAC where the D/A conversion unit 80 is disposed, an area ADC where the A/D conversion unit 20 is disposed, an area DSPL where the processing unit 50 is disposed, and an area FAM where the memory unit 30 (nonvolatile memory) is disposed. Moreover, the substrate KBN is provided with a first pad area RY1 where pads CLKO, XI, and VD (terminals) are provided and a second pad area RY2 where pads VS, XO, and EN (terminals) are provided. Moreover, the substrate KBN can be provided with areas BSA and BSD where a power supply circuit 40 (power supply circuit 40 in FIGS. 4 and 6) is disposed, an area TG where a clock signal generating circuit (e.g., a CR oscillation circuit) that supplies a clock signal to the processing unit 50 is disposed, and an area DCC where a capacitor (e.g., a capacitor of a filter circuit 120 in FIG. 10) of the D/A conversion unit 80 is disposed.

More specifically, as will be described later in FIG. 6, the A/D conversion unit 20 includes an analog unit 26 and a logic unit 22, and the D/A conversion unit 80 includes an analog unit 84 and a logic unit 82. In this case, the analog unit 26 of the A/D conversion unit 20 is disposed in the area ADC. The analog unit 84 of the D/A conversion unit 80 is disposed in the area DAC. The processing unit 50, the logic unit 22 of the A/D conversion unit 20, and the logic unit 82 of the D/A conversion unit 80 are disposed in the area DSPL.

The "area" such as the area DAC, ADC, DSPL, or FAM is an area where a transistor and the like that constitute a circuit disposed in the area, and a wiring line for a signal that the transistor processes, are disposed. The transistor includes an impurity region that constitutes the source or drain of the transistor, and a polysilicon layer that constitutes the gate. The impurity region and the polysilicon layer, and the wiring line connected to the impurity region and the polysilicon layer are disposed in the "area".

As shown in FIG. 2, a direction crossing a first direction DR1 is defined as a second direction DR2; a direction opposite to the second direction DR2 is defined as a third direction DR3; and a direction opposite to the first direction DR1 is defined as a fourth direction DR4. For example, the second direction DR2 is a direction that is orthogonal to the first direction DR1 and rotated 90 degrees clockwise from the first direction DR1.

The area OSC where the oscillation circuit 150 is disposed is provided adjacent to the area BUF where the buffer circuit 160 is disposed, on the first direction DR1 side of the area OSC. The area OSC and the area BUF have the same width (including substantially the same) in the second direction DR2 (the third direction DR3), and the area OSC and the area BUF, when joined together, form a rectangular area. The area DAC where the D/A conversion unit 80 is disposed is provided adjacent to the area ADC where the A/D conversion unit 20 is disposed, on the first direction DR1 side of the area DAC. The area DAC and the area ADC have the same width (including substantially the same) in the second direction DR2 (the third direction DR3), and the area DAC and the area ADC, when joined together, form a rectangular area. The rectangular area formed by the area DAC and the area ADC joined together is provided adjacent to the rectangular area formed by the area OSC and the area BUF joined together, on the second direction DR2 side of the rectangular area.

The term "adjacent to" as used herein means that another circuit block is not provided between the arrangement areas of circuit blocks. However, for example, a power supply wiring line, a signal wiring line, a guard area (guard bar), a test circuit (e.g., a circuit for outputting a signal of a signal line to a test terminal), or the like may be provided.

The area DSPL where the processing unit 50 is provided is provided adjacent to the area DAC and the area ADC on the second direction DR2 side thereof. A portion of the area DSPL is disposed in the first pad area RY1. A portion of the area DSPL outside the first pad area RY1 is a rectangular area with its sides along the first direction DR1 (the fourth direction DR4) being long sides. The area DSPL is disposed such that one of the long sides is adjacent to the area DAC and the area ADC.

The area FAM where the memory unit 30 is provided is provided adjacent to the area DSPL on the second direction DR2 side thereof. The area FAM is a rectangular area with its sides along the first direction DR1 (the fourth direction DR4) being long sides. The area FAM is disposed such that one of the long sides is adjacent to the area DSPL (the other long side of the rectangular area as the portion of the area DSPL outside the first pad area RY1).

The sides of the substrate KBN on the fourth direction DR4 side, the first direction DR1 side, the second direction DR2 side, and the third direction DR3 side, as viewed from the center of the substrate KBN, are respectively defined as a first side HN1, a second side HN2, a third side HN3, and a fourth side HN4.

The first pad area RY1 is provided between the areas BUF, ADC, DSPL, and FAM and the first side HN1, and the long sides of the first pad area RY1 are provided along the first side HN1. A portion of the area TG is disposed in the first pad area RY1. The areas BSA and BSD where the power supply circuit 40 is disposed are disposed in the first pad area RY1. The area BSA is provided close to the D/A conversion unit 80 or the A/D conversion unit 20, and a power supply circuit (a reference voltage generating circuit 41 or 43 in FIG. 4, or a reference voltage generating circuit 47 in FIG. 6) for the analog circuit is provided in the area BSA. The area BSD is provided close to the processing unit 50, and a power supply circuit (a reference voltage generating circuit 42 in FIGS. 4 and 6) for the digital circuit is provided in the area BSD. In the first pad area RY1, the pad CLKO (output terminal), the pad XI (first terminal for the resonator), and the pad VD (first power supply terminal) are provided in this order along the long-side direction (the second direction DR2) of the first pad area RY1. For example, the pad CLKO is provided at the corner where the sides HN1 and HN4 cross each other, and the pad VD is provided at the corner where the sides HN1 and HN3 cross each other. The pad CLKO corresponds to the output terminal to which the output signal SQ of the buffer circuit 160 is output. The pad XI corresponds to the first terminal for the resonator to which one end of the resonator XTAL is connected. The pad VD corresponds to the first power supply terminal supplied with a high potential-side power supply of the circuit device.

The second pad area RY2 is provided between the areas OSC, DAC, and FAM and the second side HN2, and the long sides of the second pad area RY2 are provided along the second side HN2. A portion of the area DSPL is disposed in the second pad area RY2. The area DCC where the capacitor of the D/A conversion unit 80 is disposed is disposed in the second pad area RY2. In the second pad area RY2, the pad VS (second power supply terminal), the pad XO (second terminal for the resonator), and the pad EN (enable terminal) are provided in this order along the long-side direction (the second direction DR2) of the second pad area RY2. For example, the pad VS is provided at the corner where the sides HN2 and HN4 cross each other, and the pad EN is provided at the corner where the sides HN2 and HN3 cross each other. The pad VS corresponds to the second power supply terminal supplied with a low potential-side power supply of the circuit device. The pad XO corresponds to the second terminal for the resonator to which the other end of the resonator XTAL is connected. The pad EN corresponds to the enable terminal to which an enable signal (a signal to control the enabling or disenabling operation of the circuit device) is input from an external processing unit (e.g., a processing unit 520 in FIG. 16B).

The pad arrangement is not limited to this. For example, the pads XI and XO may change places, or the pads VD and VS may change places.

The "pad area" (I/O area) as used herein means an area where a pad for connecting the circuit of the semiconductor chip with an external circuit is disposed. The pad is formed of, for example, the uppermost metal layer of a plurality of metal layers, and a portion of the uppermost metal layer exposed from a protective film (passivation layer) corresponds to the pad. In the pad area, an input/output cell (I/O cell) may be disposed in addition to the pad, or a portion of a circuit block may be disposed as in FIG. 2.

Next, the second layout configuration example in FIG. 3 will be described.

In FIG. 3, the second direction DR2 is a direction that is rotated 90 degrees counterclockwise from the first direction DR1 (the first direction DR1 and the second direction DR2 cross each other in a broad sense). Moreover in FIG. 3, the power supply circuit 40 is provided in an area BS.

The area BUF where the buffer circuit 160 is disposed is provided adjacent to the area OSC where the oscillation circuit 150 is disposed, on the second direction DR2 side of the area OSC. The area OSC and the area BUF have the same width (including substantially the same) in the fourth direction DR4 (the first direction DR1), and the area OSC and the area BUF, when joined together, form a rectangular area.

The area BS where the power supply circuit 40 is disposed is provided adjacent to the area DAC where the D/A conversion unit 80 is disposed, on the fourth direction DR4 side of the area DAC. The area ADC where the A/D conversion unit 20 is disposed is provided adjacent to the area BS on the fourth direction DR4 side thereof. The area DAC, the area BS, and the area ADC have the same width (including substantially the same) in the second direction DR2 (the third direction DR3), and the area DAC, the area BS, and the area ADC, when joined together, form a rectangular area.

The area FAM where the memory unit 30 is provided is provided adjacent to the area DSPL where the processing unit 50 is provided, on the second direction DR2 side of the area DSPL. The width of the area FAM in the fourth direction DR4 is smaller than the width of the area DSPL in the fourth direction DR4. A portion of the area DSPL is disposed on the fourth direction DR4 side of the area FAM. The area FAM is a rectangular area with its sides along the first direction DR1 (the fourth direction DR4) being long sides. The area FAM is disposed such that one of the long sides and one of the short sides are adjacent to the area DSPL. The area FAM and the area DSPL, when joined together, form a rectangular area.

The width of the rectangular area, formed by the area FAM and the area DSPL joined together, in the fourth direction DR4 is the same as the width of the rectangular area, formed by the area DAC, the area BS, and the area ADC joined together, in the fourth direction DR4. The rectangular area formed by the area FAM and the area DSPL joined together is provided on the second direction DR2 side of the rectangular area formed by the area DAC, the area BS, and the area ADC joined together. These two rectangular areas are provided on the fourth direction DR4 side of the rectangular area formed by the area OSC and the area BUF joined together.

The sides of the substrate KBN on the second direction DR2 side, the third direction DR3 side, the fourth direction DR4 side, and the first direction DR1 side, as viewed from the center of the substrate KBN, are respectively defined as the first side HN1, the second side HN2, the third side HN3, and the fourth side HN4.

The first pad area RY1 is provided between the areas BUF, FAM, and DSPL and the first side HN1, and the long sides of the first pad area RY1 are provided along the first side HN1. The second pad area RY2 is provided between the areas OSC, DAC, BS, and ADC and the second side HN2, and the long sides of the second pad area RY2 are provided along the second side HN2. The area TG is disposed in the first pad area RY1.

According to the layout configuration examples in FIGS. 2 and 3, the circuit device includes the A/D conversion unit 20 performing the A/D conversion of the temperature detection voltage VTD from the temperature sensor unit 10 and outputting the temperature detection data DTD, the processing unit 50 performing the temperature compensation process of the oscillation frequency based on the temperature detection data DTD and outputting the frequency control data DDS of the oscillation frequency, and the oscillation signal generating circuit 140 generating, using the frequency control data DDS from the processing unit 50 and the resonator XTAL, the oscillation signal SSC at the oscillation frequency set by the frequency control data DDS. The oscillation signal generating circuit 140 includes the D/A conversion unit 80 performing the D/A conversion of the frequency control data DDS from the processing unit 50, and the oscillation circuit 150 generating the oscillation signal SSC using the output voltage (e.g., the frequency control voltage VQ) of the D/A conversion unit 80 and the resonator XTAL. The D/A conversion unit 80 (the area DAC) is disposed on the first direction DR1 side of the A/D conversion unit 20 (the area ADC). The processing unit 50 (the area DSPL) is disposed on the second direction DR2 side of the A/D conversion unit 20 and the D/A conversion unit 80. The oscillation circuit 150 (the area OSC) is disposed on the third direction DR3 side or the first direction DR1 side of the D/A conversion unit 80.

In FIG. 2, the oscillation circuit 150 is disposed on the third direction DR3 side of the D/A conversion unit 80, and the processing unit 50 is disposed on the second direction DR2 side of the D/A conversion unit 80. The third direction DR3 and the second direction DR2 are opposite to each other. Therefore, the oscillation circuit 150 and the processing unit 50 are disposed with the D/A conversion unit 80 therebetween, and the oscillation circuit 150 and the processing unit 50 can be separated from each other.

In FIG. 3, the oscillation circuit 150 is disposed on the first direction DR1 side of the D/A conversion unit 80, and the processing unit 50 is disposed on the second direction DR2 side of the D/A conversion unit 80. That is, as viewed from the D/A conversion unit 80, the oscillation circuit 150 and the processing unit 50 are disposed in the two directions DR1 and DR2 crossing each other. With this configuration, the oscillation circuit 150 and the processing unit 50 can be separated from each other in the oblique direction.

In this manner, the oscillation circuit 150 and the processing unit 50 can be disposed separate from each other in the layouts of FIGS. 2 and 3. Therefore, the noise caused by digital signal processing of the processing unit 50 can be inhibited from propagating to the oscillation circuit 150 through, for example, the substrate or the like, and thus the characteristics (e.g., phase noise characteristics, etc.) of the oscillation signal can be improved.

Specifically, the oscillation circuit 150 is disposed adjacent to the D/A conversion unit 80 on the third direction DR3 side or the first direction DR1 side thereof. With this configuration, the frequency control voltage VQ from the D/A conversion unit 80 can be input to the oscillation circuit 150 through a short wiring line. The noise of the frequency control voltage VQ influences the characteristics of the oscillation signal. However, since the wiring line can be shortened, disturbance (noise) to the frequency control voltage VQ can be reduced.

Moreover, the circuit device of the embodiment includes the memory unit 30 (the area FAM) storing the coefficient data (gain coefficient data) of the approximate Nth-order function (polynomial) of the temperature compensation process and supplying the coefficient data to the processing unit 50 (the area DSPL). The memory unit 30 is disposed on the second direction DR2 side of the processing unit 50.

As described above, the D/A conversion unit 80 is disposed on the first direction DR1 side of the A/D conversion unit 20, and the processing unit 50 is disposed on the second direction DR2 side of the A/D conversion unit 20 and the D/A conversion unit 80. That is, the D/A conversion unit 80 and the A/D conversion unit 20, the processing unit 50, and the memory unit 30 are disposed in this order in the second direction DR2. With this configuration, wiring lines can be efficiently routed between the D/A conversion unit 80 and the A/D conversion unit 20, and the processing unit 50, and between the memory unit 30 and the processing unit 50. Since these units are connected with a number of digital signal wiring lines, the efficient routing contributes to a reduced layout area. Moreover, since the routing of digital signal wiring lines is reduced, noise spread from the digital signal wiring lines is reduced, and thus the characteristics of the oscillation signal can be improved in a digital oscillator such as the DTCXO.

Moreover, in the embodiment, the processing unit 50 (the area DSPL) and the memory unit 30 (the area FAM) are disposed such that the long-side directions thereof are along the first direction DR1.

Specifically, in FIG. 2, the area DSPL outside the first pad area RY1 is a rectangular area, and the long-side direction thereof corresponds to the long-side direction of the processing unit 50. Alternatively, in FIG. 3, the area DSPL except for the portion projecting to the fourth direction DR4 side of the memory unit 30 (the area FAM) is a rectangular area, and the long-side direction thereof corresponds to the long-side direction of the processing unit 50.

As described above, the memory unit 30 is disposed on the second direction DR2 side of the processing unit 50, and also the long-side directions of the processing unit 50 and the memory unit 30 are along the first direction DR1, so that the processing unit 50 and the memory unit 30 can be disposed with the long-side directions thereof being opposed to each other. Since the coefficient data of the approximate Nth-order function of the temperature compensation process is supplied from the memory unit 30 to the processing unit 50, a number of signal lines for the coefficient data can be routed between the long sides opposed to each other. For example, when the approximate Nth-order function is a fifth function (N=5) and the coefficient data is of 7 bits, 5×7=35 signal lines are required to transmit the coefficient data. As will be described later in FIGS. 9A to 9C and the like, very high oscillation frequency accuracy is required in a digital oscillator such as the DTCXO in, for example, applications to communications by the TDD system. Therefore, the order of the approximate Nth-order function or the number of bits of the coefficient data tends to further increase, and thus the number of signal lines for transmitting the coefficient data will increase and be greater than 5×7=35. In such a case, the routing of the signal lines for transmitting the coefficient data becomes difficult; however, this problem can be solved in the embodiment because the long-side directions of the processing unit 50 and the memory unit 30 are opposed to each other.

Moreover, the circuit device of the embodiment includes the buffer circuit 160 (the area BUF) buffering the oscillation signal SSC of the oscillation circuit 150 (the area OSC). When the oscillation circuit 150 is disposed on the third direction DR3 side of the D/A conversion unit 80 (the area DAC) as in FIG. 2, the buffer circuit 160 is disposed on the fourth direction DR4 side of the oscillation circuit 150. Alternatively, when the oscillation circuit 150 is disposed on the first direction DR1 side of the D/A conversion unit 80 as in FIG. 3, the buffer circuit 160 is disposed on the second direction DR2 side of the oscillation circuit 150.

By doing this, as viewed from the oscillation circuit 150, the D/A conversion unit 80 and the buffer circuit 160 can be disposed in the third direction DR3 and the fourth direction DR4 (FIG. 2) crossing each other or in the first direction DR1 and the second direction DR2 (FIG. 3) crossing each other. With this configuration, the buffer circuit 160 can be efficiently disposed while maintaining the positional relationship among the oscillation circuit 150, the D/A conversion unit 80, and the processing unit 50 to address noise. The buffer circuit 160 is desirably disposed close to the oscillation circuit 150 because the buffer circuit 160 buffers the oscillation signal SSC from the oscillation circuit 150, and, according to the embodiment, the buffer circuit 160 can be disposed adjacent to the oscillation circuit 150.

Moreover, the circuit device of the embodiment includes the output terminal (the pad CLKO) for outputting the signal SQ based on the oscillation signal SSC of the oscillation circuit 150, the first terminal (the pad XI) for the resonator and the second terminal (the pad XO) for the resonator connected with the resonator XTAL, the first power supply terminal (the pad VD) and the second power supply terminal (the pad VS) supplied with the power supply voltage, and the enable terminal (the pad EN). The output terminal, the first terminal for the resonator, and the first power supply terminal (the pads CLKO, XI, and VD) are disposed in the first pad area RY1 along the first side HN1 of the circuit device. The second power supply terminal, the second terminal for the resonator, and the enable terminal (the pads VS, XO, and EN) are disposed in the second pad area RY2 along the second side HN2 of the circuit device opposed to the first side HN1. The long-side directions of the first pad area RY1 and the second pad area RY2 are the third direction DR3 or the first direction DR1.

By doing this, the first pad area RY1 and the second pad area RY2 are provided at the first side HN1 and the second side HN2 opposed thereto, and circuit blocks can be disposed between the first pad area RY1 and the second pad area RY2.

3. Power Supply Circuit

Figure 4:
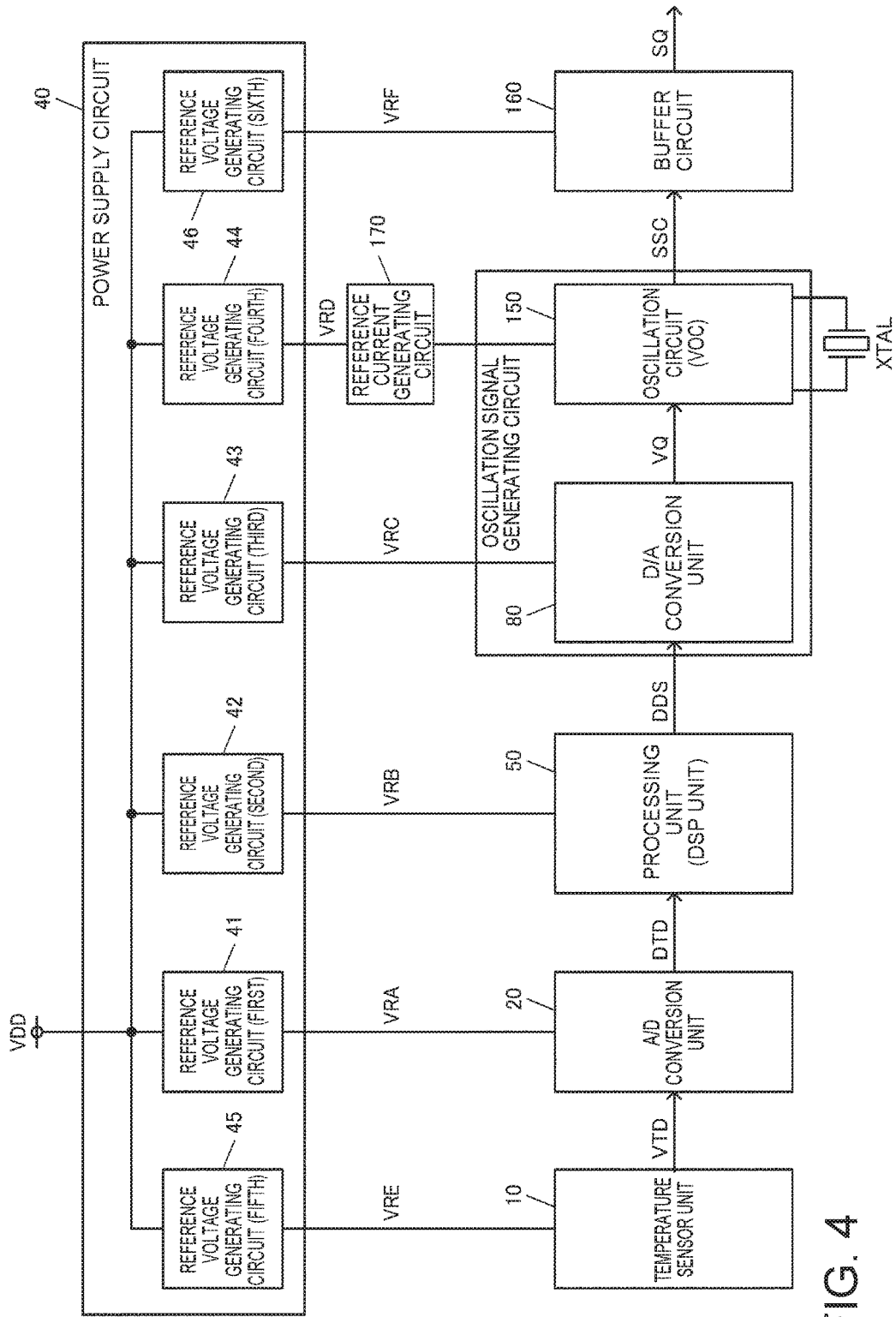
FIG. 4 shows a first detailed configuration example of the circuit device.

Hereinafter, the power supply circuit will be described in detail. FIG. 4 shows a first detailed configuration example of the circuit device.

The circuit device of the embodiment includes the power supply circuit 40 and a digital temperature compensated oscillation circuit that operates with a power supply voltage supplied from the power supply circuit 40. The digital temperature compensated oscillation circuit includes the A/D conversion unit 20 and the oscillation signal generating circuit 140. Moreover, the circuit device can include the temperature sensor unit 10 and the buffer circuit 160. An external power supply (a power supply voltage VDD) is supplied to the power supply circuit 40. The power supply circuit 40 includes at least one reference voltage generating circuit that generates a reference voltage generated based on a work function difference of a transistor. The power supply circuit 40 supplies the reference voltage generated by the reference voltage generating circuit as a power supply voltage.

According to the embodiment, the reference voltage is generated based on the work function difference of the transistor, and the reference voltage is supplied as the power supply voltage to the digital temperature compensated oscillation circuit. With this configuration, a digital oscillator such as the DTCXO capable of reducing power consumption of a power supply can be realized.

In the related art, a bandgap reference circuit used as a reference voltage generating circuit uses a plurality of bipolar transistors (P-N junctions included in the bipolar transistors) to cancel the temperature dependence of a bandgap voltage, and thus is a circuit having a relatively large consumption current due to a bias current or the like flowing into the transistors. Therefore, the bandgap reference circuit has a problem in that it is difficult to reduce its consumption current while maintaining a high PSRR. Since the noise characteristics of a power supply influence the accuracy (e.g., phase noise characteristics) of an oscillation signal, a high PSRR is necessary. From this perspective, a power supply circuit using the bandgap reference circuit has a limit to reduce power consumption.

In this regard, the reference voltage is generated based on the work function difference of the transistor in the embodiment, so that it is possible to maintain a high PSRR while reducing a consumption current, compared with the case where the bandgap reference circuit is used. For example, as will be described later with reference to FIG. 7, a differential pair is composed of a transistor TAc and a transistor TAd in each of which the work function is different between the gate electrode and the substrate, and the output of the differential pair is fed back to the differential pair through a transistor TAe, so that the reference voltage can be generated. Since the reference voltage generating circuit can be configured with a simple configuration when using a work function difference as described above, it is easy to reduce a bias current.

However, the reference voltage generated based on the work function difference of the transistor has temperature characteristics (e.g., negative temperature characteristics). When the reference voltage is supplied as a power supply voltage to each unit of the circuit device, the temperature dependence of the power supply voltage influences the temperature characteristics of the oscillation frequency (the temperature characteristics of the oscillation frequency change compared with the case where the power supply voltage has no temperature dependence). In this regard, the digital temperature compensated oscillation circuit performs temperature compensation in the embodiment, and the oscillation frequency can be temperature compensated comprehensively, including the temperature dependence of the power supply voltage, in the digital temperature compensated oscillation circuit. With this configuration, it is possible to use the reference voltage generated based on the work function difference of the transistor.

Since a high PSRR is obtained with low power consumption, the power consumption of the power supply circuit 40 built in the circuit device is reduced and a highly accurate oscillation signal with less phase noise is obtained. Moreover, since a high PSRR is obtained, a switching regulator can be used as an external power supply on the upperstream side. With this configuration, the power consumption of the external power supply of the circuit device can be reduced. As described above, the reference voltage is generated based on the work function difference of the transistor, and the reference voltage is supplied as a power supply voltage to the digital temperature compensated oscillation circuit, so that the power consumption of the power supply of the entire system including the internal power supply or external power supply of the circuit device can be reduced.

That the oscillation frequency can be temperature compensated comprehensively, including the temperature dependence of the power supply voltage, in a digital oscillator such as the DTCXO will be described in more detail.

Figure 5A:
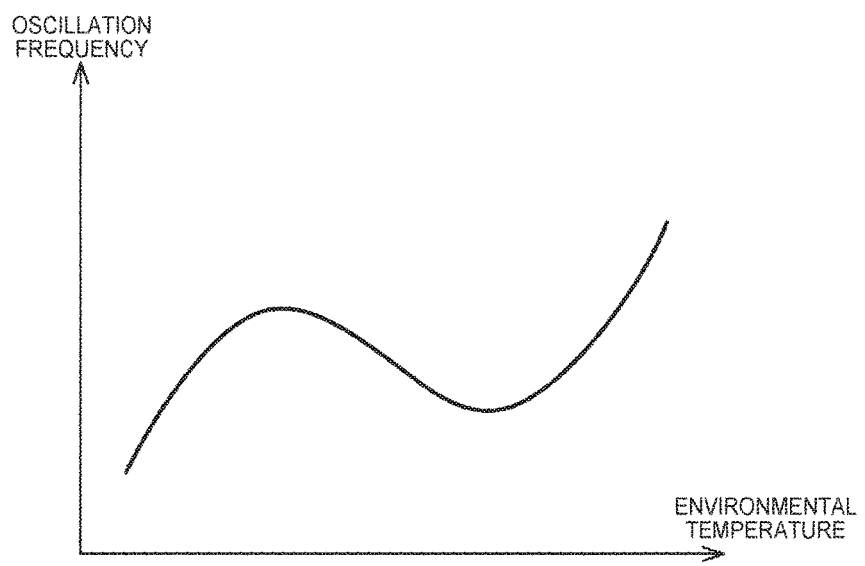
FIG. 5A shows an example of the temperature dependence of an oscillation frequency.

First, consider an analog oscillator such as the ATCXO as a comparative example of the embodiment. The ATCXO compensates for the temperature dependence of an oscillation frequency to obtain a highly accurate oscillation frequency; however, the oscillation frequency before being temperature compensated has, for example, temperature dependence shown in FIG. 5A. In the ATCXO, some environmental temperatures are set in a constant-temperature oven, an oscillation frequency at each environmental temperature is measured, the coefficient of a polynomial for canceling the measured temperature dependence is determined, and the coefficient is written into a nonvolatile memory or the like. When performing temperature compensation, the coefficient is read from the nonvolatile memory to generate a frequency control voltage corresponding to the output of a temperature sensor, and the temperature dependence of the oscillation frequency is compensated for.

In the temperature compensation of the ATCXO as described above, the relationship between the output of the temperature sensor and the frequency control voltage is determined by the polynomial; however, the relationship obtained when determining the coefficient is a relationship between the environmental temperature and the oscillation frequency. Therefore, in an algorithm for determining the coefficient, for example, what output of the temperature sensor is obtained with respect to the environmental temperature or what frequency control voltage a function generating circuit outputs with respect to the output of the temperature sensor is presumed as a premise. When this premise breaks down, the algorithm cannot determine a correct coefficient. For example, the temperature sensor detects temperature based on a difference between a voltage having no temperature dependence and a voltage having temperature dependence. However, when these voltages are influenced by the temperature dependence of the power supply voltage, the sensor output (difference voltage) with respect to the environmental temperature fails to meet expectations. However, the algorithm for determining the coefficient computes the coefficient on the premise that the correspondence between the environmental temperature and the sensor output exhibits expected characteristics. Therefore, when the correspondence between the environmental temperature and the sensor output varies, temperature compensation cannot be correctly performed. For the reasons described above, a highly stable power supply voltage having no temperature dependence is required in the ATCXO.

Figure 5B:
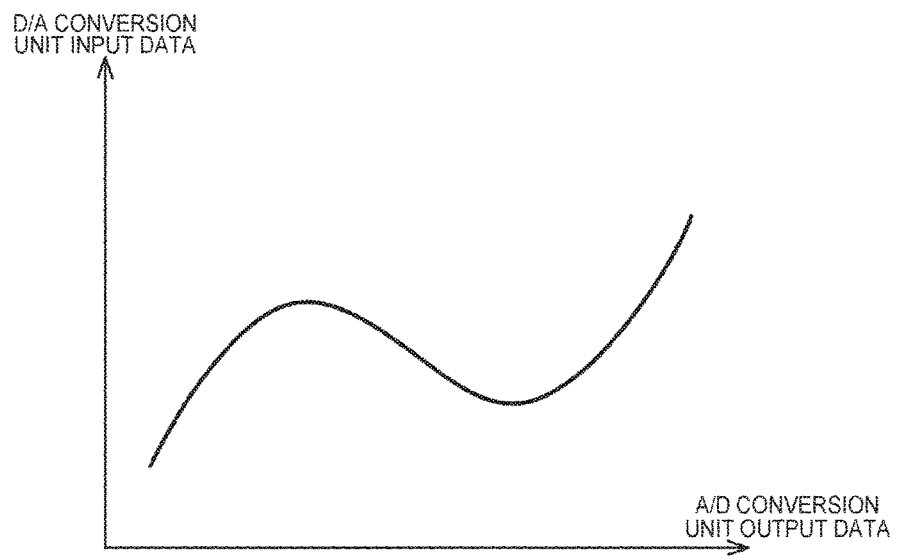
FIG. 5B shows an example of the relationship between input data of a processing unit and output data of the processing unit.

On the other hand, in a digital oscillator such as the DTCXO like the embodiment, the relationship between the temperature detection data DTD (the input data of the processing unit 50) and the frequency control data DDS (the output data of the processing unit 50) is obtained as shown in FIG. 5B. For example, the temperature detection data DTD and the frequency control data DDS are stored in a register of the processing unit 50, and externally read through a digital interface (not shown). When determining the coefficient for temperature compensation, some environmental temperatures are set in a constant-temperature oven, the temperature detection data DTD and the frequency control data DDS at each environmental temperature are obtained, and fitting is performed using a polynomial to determine the coefficient of a polynomial for temperature compensation.

When performing temperature compensation, the processing unit 50 reads the coefficient from the memory unit 30 (nonvolatile memory, not shown), and generates the frequency control data DDS (the input data of the D/A conversion unit 80) corresponding to the temperature detection data DTD (the output data of the A/D conversion unit 20). That is, the digital oscillator such as the DTCXO uses the relationship between the temperature detection data DTD and the frequency control data DDS both when determining the coefficient and when performing temperature compensation. For this reason, the premise for the algorithm as in the ATCXO is not needed, and even when temperature dependence (e.g., output fluctuations of the temperature sensor caused by the temperature characteristics of the power supply voltage) is present at the front stage or back stage of the processing unit 50, the temperature characteristics are contained in the relationship between the temperature detection data DTD and the frequency control data DDS. With this configuration, temperature compensation can be performed comprehensively, including not only the temperature characteristics of the oscillation frequency of the resonator but also the temperature dependence of each unit of the circuit device.

Hereinafter, the configuration of the power supply circuit 40 will be described in further detail. As shown in FIG. 4, the power supply circuit 40 includes first to sixth reference voltage generating circuits 41 to 46. Moreover, the circuit device can include a reference current generating circuit 170.

The first reference voltage generating circuit 41 supplies a first reference voltage generated based on the work function difference as a first power supply voltage VRA to the A/D conversion unit 20. The second reference voltage generating circuit 42 supplies a second reference voltage generated based on the work function difference as a second power supply voltage VRB to the processing unit 50. The third reference voltage generating circuit 43 supplies a third reference voltage generated based on the work function difference as a third power supply voltage VRC to the D/A conversion unit 80.

The power supply circuit 40 does not necessarily include all of the first reference voltage generating circuit 41, the second reference voltage generating circuit 42, and the third reference voltage generating circuit 43, and may include any one or two of them.

By providing the first reference voltage generating circuit 41, the second reference voltage generating circuit 42, and the third reference voltage generating circuit 43 respectively corresponding to the A/D conversion unit 20, the processing unit 50, and the D/A conversion unit 80 as described above, the power supply lines of the units can be separated from each other. With this configuration, it is possible to inhibit the propagation of noise through the power supply lines and improve the accuracy (e.g., phase noise characteristics) of the oscillation signal.

For example, the noise of a digital circuit influences the oscillation of the resonator XTAL caused by the oscillation circuit 150, and degrades phase noise characteristics or the like. In this regard, since the second reference voltage generating circuit 42 corresponding to the processing unit 50 is provided in the embodiment, the power supply line of the processing unit 50 as a digital circuit can be separated from the power supply line of the oscillation circuit 150. With this configuration, it is possible to inhibit the propagation of the noise of the digital circuit to the oscillation circuit 150. In another case, when noise from the processing unit 50 or the oscillation circuit 150 is input to the A/D conversion unit 20 or the D/A conversion unit 80, the noise may cause a reduction in the conversion accuracy of the A/D conversion unit 20 to thereby influence the accuracy of temperature compensation, or noise may increase in the output voltage VQ of the D/A conversion unit 80 to thereby degrade phase noise characteristics or the like. In this regard, since the first reference voltage generating circuit 41 corresponding to the A/D conversion unit 20 is provided or the third reference voltage generating circuit 43 corresponding to the D/A conversion unit 80 is provided in the embodiment, it is possible to inhibit the propagation of the noise to the A/D conversion unit 20 or the D/A conversion unit 80.

Moreover, although the power supply voltages VRA, VRB, and VRC are generated using the work function differences having temperature characteristics in the embodiment, the influences thereof can be comprehensively compensated for by a digital temperature compensation process. That is, temperature characteristics may be provided in the conversion result of the A/D conversion unit 20 or the D/A conversion unit because the power supply voltages VRA and VRC have temperature characteristics; however, temperature characteristics including the temperature characteristics in the conversion result are compensated for by the digital temperature compensation process.

Figure 7:
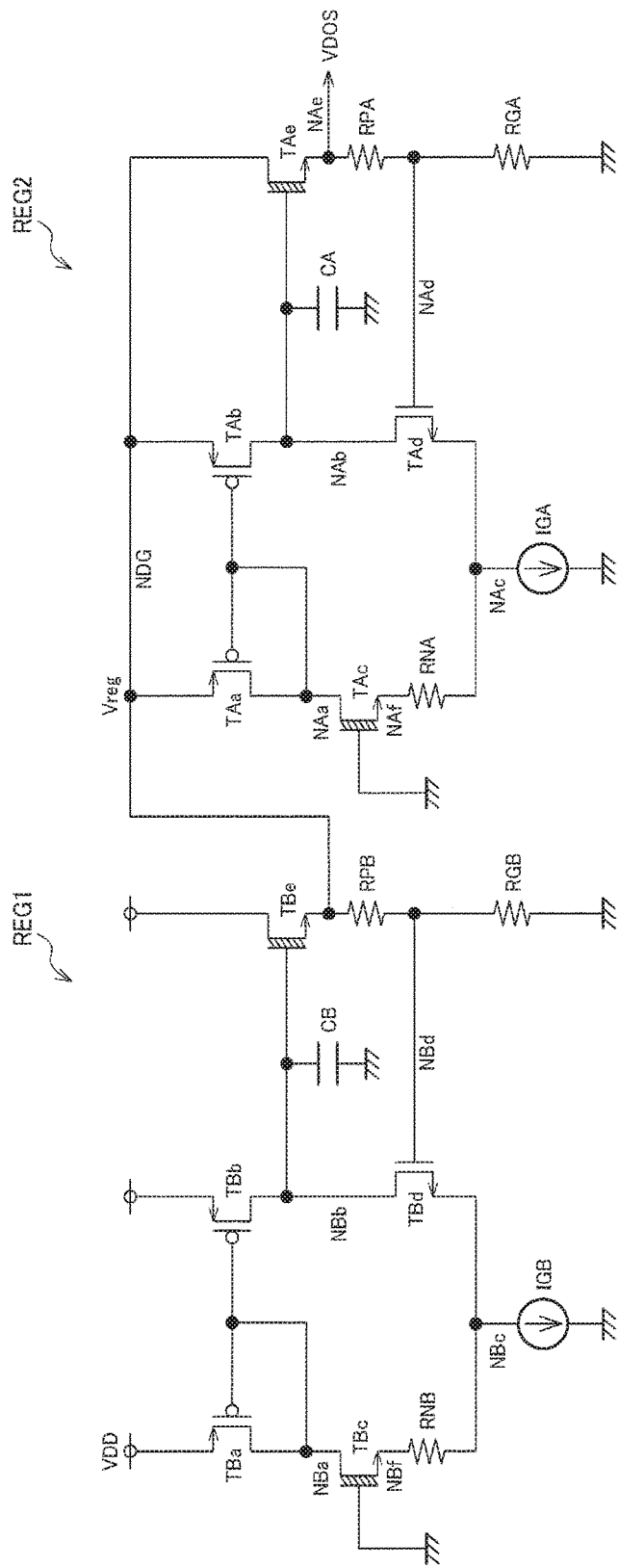
FIG. 7 shows a detailed configuration example of a reference voltage generating circuit.

Moreover, as shown in FIG. 7, since a work function difference amplifier that generates a reference voltage using a work function difference can be composed of MOS transistors and resistors and has a simple configuration, the layout area of the work function difference amplifier is smaller than that of the bandgap reference circuit using bipolar transistors. Therefore, an increase in layout area is suppressed even when the reference voltage generating circuits are provided for the respective units, so that the work function difference amplifier is suitable for a configuration with separated power supply lines.

The reference current generating circuit 170 generates a reference current based on a reference voltage. Then, the oscillation circuit 150 causes the resonator XTAL to oscillate with a drive current based on the reference current.

Specifically, the fourth reference voltage generating circuit 44 generates a reference voltage based on a work function difference, and outputs the reference voltage as a fourth power supply voltage VRD to the reference current generating circuit 170. Then, as will be described later with reference to FIG. 8, the reference current generating circuit 170 generates a reference current IRD based on the reference voltage (the power supply voltage VRD), and outputs bias voltages QD1 and QD2 corresponding to the reference current IRD to the oscillation circuit 150. The oscillation circuit 150 converts the bias voltages QD1 and QD2 into a drive current IBX with transistors TDd and TDe. A bipolar transistor TRX supplied with the drive current IBX drives the resonator XTAL.

By providing the reference current generating circuit 170 corresponding to the oscillation circuit 150 as described above, the oscillation circuit 150 can be separated from the power supply lines of the other circuits such as the processing unit 50. With this configuration, it is possible to inhibit the propagation of noise through the power supply lines and improve the accuracy (e.g., phase noise characteristics) of the oscillation signal. Moreover, although the reference voltage is generated using the work function difference having temperature characteristics in the embodiment, the influences thereof can be comprehensively compensated for by the digital temperature compensation process. That is, temperature characteristics may be provided in the oscillation frequency characteristics of the oscillation circuit 150 because the reference voltage has temperature characteristics; however, temperature characteristics including the temperature characteristics in the oscillation frequency characteristics are compensated for by the digital temperature compensation process.

The fifth reference voltage generating circuit 45 supplies a fifth reference voltage generated based on a work function difference as a fifth power supply voltage VRE to the temperature sensor unit 10. The sixth reference voltage generating circuit 46 supplies a sixth reference voltage generated based on a work function difference as a sixth power supply voltage VRF to the buffer circuit 160.

By doing this, the power supply line of the temperature sensor unit 10 or the buffer circuit 160 can be separated, so that it is possible to inhibit the propagation of noise through the power supply lines. Moreover, even if the temperature characteristics of the reference voltage influence the sensor characteristics or the like of the temperature sensor unit 10, the influence can be comprehensively compensated for by the digital temperature compensation process.

Figure 6:
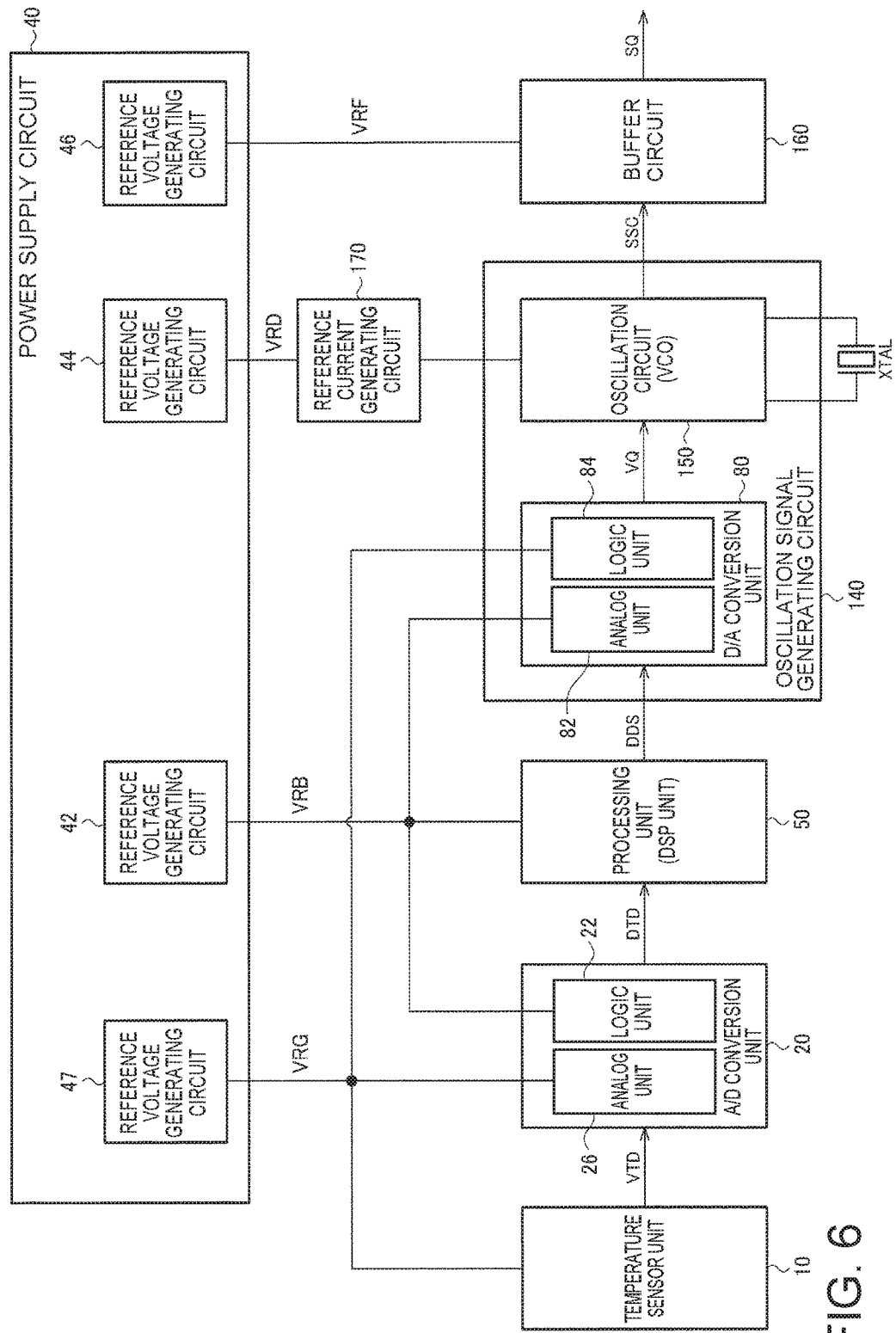
FIG. 6 shows a modified configuration example of the circuit device and a power supply circuit.

The configuration of the power supply circuit 40 is not limited to that shown in FIG. 4, and the power supply circuit 40 may be configured as shown in, for example, FIG. 6. FIG. 6 shows a modified configuration example of the circuit device and the power supply circuit 40 of the embodiment.

The circuit device in FIG. 6 includes the power supply circuit 40, the temperature sensor unit 10, the A/D conversion unit 20, the processing unit 50, the oscillation signal generating circuit 140, and the buffer circuit 160.

In FIG. 6, the power supply circuit 40 includes the reference voltage generating circuits 42, 44, 46, and 47. The A/D conversion unit 20 includes the analog unit 26 and the logic unit 22. The D/A conversion unit 80 includes the logic unit 82 and the analog unit 84. The analog unit 26 and the logic unit 22 of the A/D conversion unit 20 correspond to the analog unit 26 and the logic unit 22 in FIG. 15. The logic unit 82 of the D/A conversion unit 80 corresponds to a modulation circuit 90 in FIG. 10, and the analog unit 84 corresponds to a D/A converter 100 and the filter circuit 120 in FIG. 10.

The reference voltage generating circuit 47 supplies a reference voltage generated based on a work function difference of a transistor as a power supply voltage VRG to the temperature sensor unit 10, the analog unit 26 of the A/D conversion unit 20, and the analog unit 84 of the D/A conversion unit 80. The reference voltage generating circuit 42 supplies a reference voltage generated based on a work function difference of a transistor as the power supply voltage VRB to the logic unit 22 of the A/D conversion unit 20, the processing unit 50, and the logic unit 82 of the D/A conversion unit 80.

4. Reference Voltage Generating Circuit

FIG. 7 shows a detailed configuration example of a reference voltage generating circuit. The reference voltage generating circuit in FIG. 7 can be applied to any of the reference voltage generating circuits 41 to 47. The reference voltage generating circuit in FIG. 7 includes a first work function difference amplifier REG1 and a second work function difference amplifier REG2.

The first work function difference amplifier REG1 includes transistors TBa, TBb, TBc, TBd, and TBe, resistors RNB, RPB, and RGB (resistance elements), a capacitor CB, and a current source IGB.

The transistor TBa and the transistor TBb constitute a current mirror circuit, and supplies a current to the transistor TBc and the transistor TBd. The transistor TBc and the transistor TBd constitute a differential pair. The current source IGB supplies a bias current to the differential pair. The transistors TBa and TBb are, for example, P-type transistors, and the transistors TBc and TBd are N-type transistors. Moreover, the transistors TBa, TBb, and TBd are enhancement-type transistors, and the transistor TBc is a depletion-type transistor.

The transistors TBa and TBb are provided between high potential-side power supply nodes (nodes of the power supply voltage VDD) and nodes NBa and NBb. The power supply voltage VDD is supplied to sources of the transistors TBa and TBb, and gate electrodes of the transistors TBa and TBb are connected to the node NBa at a drain of the transistor TBa.

The transistors TBc and TBd are provided between the nodes NBa and NBb and nodes NBf and NBc. The resistor RNB is provided between the node NBf and the node NBc. A power supply voltage VSS is input to a gate electrode of the transistor TBc. A gate electrode of the transistor TBd is connected to a node NBd. The current source IGB is provided in series between the node NBc and a node of the power supply voltage VSS.

The transistor TBe is a depletion, N-type transistor. The transistor TBe is provided between a high potential-side power supply node and an output node NBe (one end of the resistor RPB), and the output node NBb of the differential pair is connected to a gate electrode of the transistor TBe. That is, the gate voltage of the transistor TBe is controlled based on the drain voltage of the transistor TBd. The capacitor CB is provided between the node NBb and the node of the power supply voltage VSS. The resistor RPB is provided between the output node NBe and the node NBd (a gate node of the transistor TBd), and a voltage Vreg corresponding to a work function difference voltage of the transistors TBc and TBd is applied to one end of the resistor RPB. The resistor RPB outputs the voltage Vreg at one end thereof to a power supply node NDG of the first work function difference amplifier REG1. The resistor RGB is provided between the node NBd and the node of the power supply voltage VSS.

The transistor TBd is a transistor whose gate electrode has conductivity different from that of the transistor TBc. For example, the gate electrode of the transistor TBc is of N-type, and the gate electrode of the transistor TBd is of P-type. For example, the transistors TBc and TBd have the same impurity concentration of the substrate or the same impurity concentration of the channel, but are different in the conductivity of the gate electrode and different in the impurity concentration of the gate electrode.

Specifically, the threshold voltage of a MOS transistor can be expressed as $Vth = \varphi_{MS} - Q_{SS}/C_{OX} + 2\varphi_F + Q_D/C_{OX}$, where $\varphi_{MS}$ is a work function difference between a gate electrode and a substrate, $Q_{SS}$ is fixed charge in an oxide film, $C_{OX}$ is the capacitance of a gate oxide film per unit area, $\varphi_F$ is a Fermi level, and $Q_D$ is charge in a depletion layer. Due to settings of the impurity concentration of the N-type gate electrode of the transistor TBc and the impurity concentration of the P-type gate electrode of the transistor TBd, a threshold voltage VTN of the transistor TBc of depletion-type is set to, for example, −0.52 V, and a threshold voltage VTP of the transistor TBd of enhancement type is set to, for example, 0.45 V. Accordingly, a voltage Vreg of VTP−VTN=0.97 V is output to the output node NDG of the reference voltage generating circuit. That is, even when the power supply voltage VDD fluctuates, the voltage Vreg that is constant can be supplied.

The second work function difference amplifier REG2 includes transistors TAa, TAb, TAc, TAd, and TAe, resistors RNA, RPA, and RGA (resistance elements), a capacitor CA, and a current source IGA.

The configuration of the second work function difference amplifier REG2 is similar to the configuration of the first work function difference amplifier REG1. That is, the transistors TAa, TAb, TAc, TAd, and TAe, the resistors RNA, RPA, and RGA, the capacitor CA, and the current source IGA correspond to the transistors TBa, TBb, TBc, TBd, and TBe, the resistors RNB, RPB, and RGB, the capacitor CB, and the current source IGB of the first work function difference amplifier REG1. The transistor TAd is a transistor whose gate electrode has conductivity different from that of the transistor TAc, and the threshold voltage VTN of the transistor TAc is different from the threshold voltage VTP of the transistor TAd. The second work function difference amplifier REG2 outputs, for example, VTP−VTN=0.9 V. That is, even when the power supply voltage VDD fluctuates, a reference voltage VDOS that is a constant voltage can be supplied.

By connecting in series the first work function difference amplifier REG1 with the second work function difference amplifier REG2 as in FIG. 7, a PSRR can be more improved than in a work function difference amplifier with one stage. That is, in a work function difference amplifier with two stages, since PSRRs at the stages are added together, a PSRR that is approximately twice that of the work function difference amplifier with one stage is obtained.

Moreover in FIG. 7, the transistor TAe is a depletion-type transistor.

In the work function difference amplifier with two stages, the first work function difference amplifier REG1 outputs the voltage Vreg=0.97 V for example, and the second work function difference amplifier REG2 outputs the voltage VDOS=0.9 V using the voltage Vreg=0.97 V as a power supply. The transistor TAe is an N-type transistor, and the source thereof is at the voltage VDOS=0.9 V. Therefore, the transistor TAe can receive only a very low gate-source voltage, at which an enhancement-type transistor cannot be turned on. In this regard, since the transistor TAe is a depletion-type transistor in the embodiment, the transistor TAe can be turned on even when the transistor TAe is an N-type transistor.

Moreover, in FIG. 7, the transistors TAe and TBe at the output stage of the work function difference amplifier are N-type transistors. With this configuration, an improvement in PSRR can be expected compared with when P-type transistors are employed. This will be described using, for example, the transistor TAe as an example. When a P-type transistor is employed as the transistor TAe, a source of the P-type transistor is at the power supply voltage VDD. Therefore, the gate-source voltage is influenced by the noise of the power supply voltage VDD, but a PSRR is maintained by the gain of the amplifier in the band of the amplifier. However, in a high-frequency band outside the band of the amplifier, the PSRR decreases under the influence of the noise of the power supply voltage VDD. On the other hand, the source of the transistor TAe is at the output voltage VDOS when an N-type transistor is employed as the transistor TAe, so that the gate-source voltage is less likely to be influenced by the noise of the power supply voltage VDD. However, since there is the problem in that it is hard to turn on the transistor as described above, a depletion-type transistor is used to solve this problem.

Moreover, in FIG. 7, the capacitor CA is provided between a gate node NAb of the transistor TAe and a low potential-side power supply node. The capacitor CB is provided between the gate node NBb of the transistor TBe and the low potential-side power supply node.

With this configuration, the PSRR in the high-frequency region can be further improved. In the low-frequency region and the high-frequency region, frequency characteristics obtained when the capacitor CA is not provided are the same as frequency characteristics obtained when the capacitor CA is provided. In the low-frequency region, the PSRR that is substantially the same as the DC gain of the amplifier is obtained; in the high-frequency region, the PSRR is determined by the ratio between the capacitance of the capacitor CA and a parasitic capacitance between the source and drain of the transistor TAe. In the frequency characteristics obtained when the capacitor CA is not provided, a frequency at which the PSRR is very low (is zero) is present between the low-frequency region and the high-frequency region. In the vicinity of this frequency fA, the noise of the power supply propagates to the reference voltage, causing degradation of phase noise characteristics.

In this regard, the PSRR in the vicinity of the frequency fA can be improved by providing the capacitor CA (CB) in the embodiment. With this configuration, a high PSRR can be obtained over a wide band, and thus phase noise characteristics can be improved.

The configuration of the reference voltage generating circuit is not limited to that shown in FIG. 7. For example, the power supply voltage VDD may be supplied to the power supply node NDG of the second work function difference amplifier REG2, and the reference voltage may be generated only by a work function difference amplifier with one stage (the second work function difference amplifier REG2).

5. Reference Current Generating Circuit and Oscillation Circuit

Figure 8:
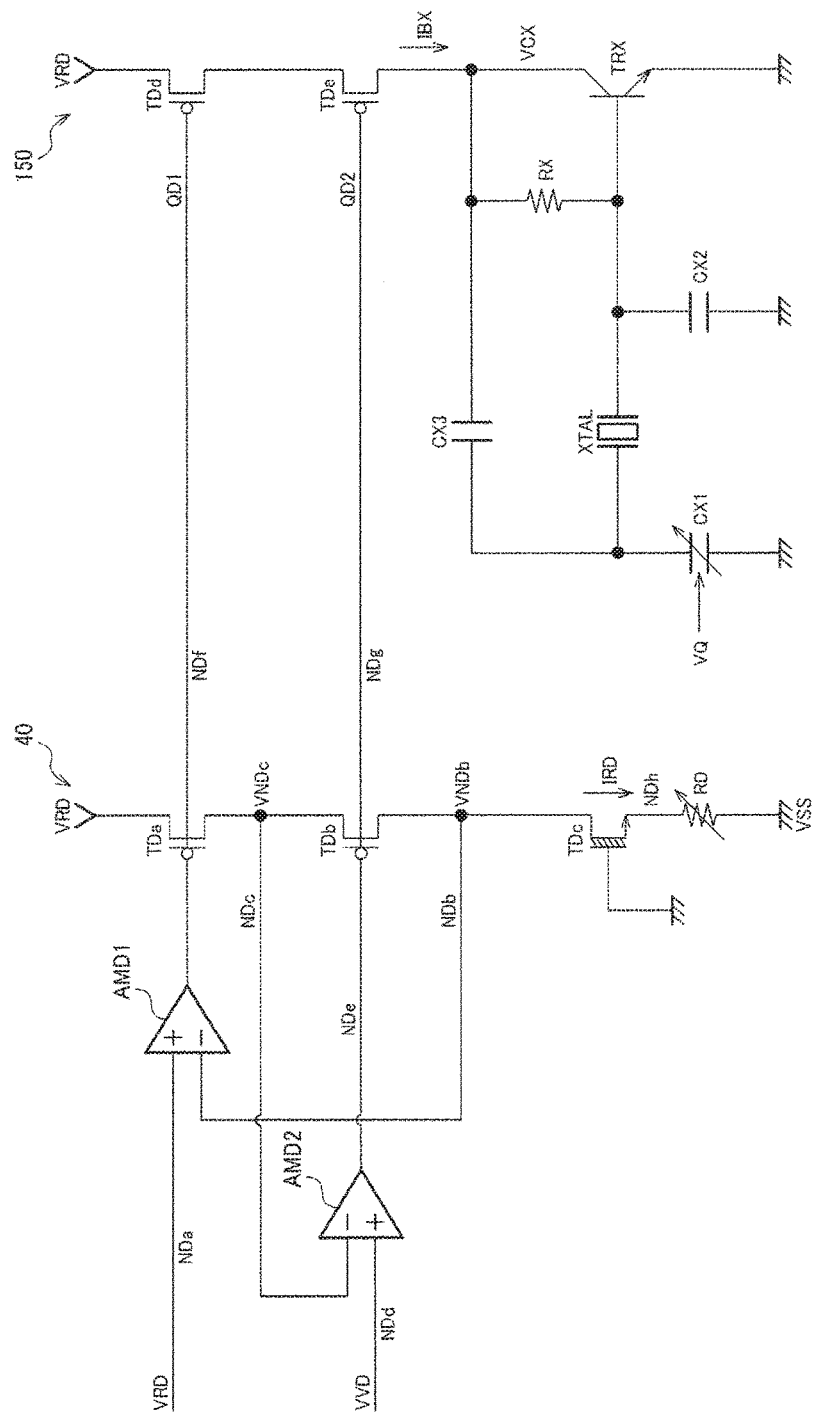
FIG. 8 shows a detailed configuration example of a reference current generating circuit and an oscillation circuit.

FIG. 8 shows a detailed configuration example of the reference current generating circuit 170 and the oscillation circuit 150. The reference current generating circuit 170 includes transistors TDa, TDb, and TDc, operational amplifiers AMD1 and AMD2, and a resistor RD.

The transistor TDa is provided between a high potential-side power supply node (a node of the power supply voltage VRD) and a first node NDc. The transistor TDb is provided between the first node NDc and a second node NDb. The transistors TDa and TDb are, for example, enhancement, P-type transistors.

The power supply voltage VRD is input to a first input node NDa (positive input node or non-inverting input node) of the operational amplifier AMD1. A second input node (negative input node or inverting input node) of the operational amplifier AMD1 is connected to the second node NDb. An output node NDf of the operational amplifier AMD1 is connected to a gate of the transistor TDa.

A predetermined voltage VVD for setting a voltage VNDc at the first node NDc is input to a first input node NDd (positive input node or non-inverting input node) of the operational amplifier AMD2. A second input node (negative input node or inverting input node) of the operational amplifier AMD2 is connected to the first node NDc. An output node NDg of the operational amplifier AMD2 is connected to a gate of the transistor TDb.

The transistor TDc is provided between the node NDb and a node NDh, and the power supply voltage VSS is input to a gate of the transistor TDc. The transistor TDc is, for example, a depletion, N-type transistor. The resistor RD is provided between the node NDh and a low potential-side power supply node. The resistor RD is a variable resistor, and can be composed of, for example, a ladder resistor or the like whose resistance value can be variably controlled by selecting a tap with a switch. The transistor TDc and the resistor RD constitute a current source that supplies a bias current to the transistors TDa and TDb. The reference current IRD can be adjusted by adjusting the resistance value of the resistor RD.

The predetermined voltage VVD is set to, for example, VVD=VRD−0.2 V, and the voltage at the first node NDc is VNDc=VVD=VRD−0.2 V through feedback control of the operational amplifier AMD2. The voltage at the second node NDb is VNDb=VRD through feedback control of the operational amplifier AMD1. Since the voltage VNDc at the first node NDc and the voltage VNDb at the second node NDb are fixed as described above and thus less likely to be influenced by the fluctuations in the high potential-side power supply (the power supply voltage VRD), the reference current IRD that is highly stable can be generated.

The oscillation circuit 150 includes the transistors TDd and TDe, the bipolar transistor TRX, a resistor RX, a variable capacitance capacitor CX1, and capacitors CX2 and CX3.

The gate voltages (the bias voltages QD1 and QD2) of the transistors TDa and TDb of the reference current generating circuit 170 are input to the transistors TDd and TDe. That is, the transistors TDd and TDe mirror the reference current IRD at a predetermined ratio, and supply the drive current IBX (bias current) to a collector of the bipolar transistor TRX. The resistor RX is provided between the collector and base of the bipolar transistor TRX.

One end of the variable capacitance capacitor CX1 whose capacitance is variable is connected to one end of the resonator XTAL. Specifically, one end of the variable capacitance capacitor CX1 is connected to one end of the resonator XTAL through the first terminal for the resonator (the pad for the resonator) of the circuit device. One end of the capacitor CX2 is connected to the other end of the resonator XTAL. Specifically, one end of the capacitor CX2 is connected to the other end of the resonator XTAL through the second terminal for the resonator (the pad for the resonator) of the circuit device. One end of the capacitor CX3 is connected to the one end of the resonator XTAL, and the other end of the capacitor CX3 is connected to the collector of the bipolar transistor TRX.

A base-emitter current that is generated by the oscillation of the resonator XTAL flows into to the bipolar transistor TRX. An increase in the base-emitter current increases a collector-emitter current of the bipolar transistor TRX and reduces a bias current branched from the drive current IBX to the resistor RX, and therefore, a collector voltage VCX decreases. On the other hand, a reduction in the base-emitter current of the bipolar transistor TRX reduces the collector-emitter current and increases the bias current branched from the drive current IBX to the resistor RX, and therefore, the collector voltage VCX increases. The collector voltage VCX is fed back to the resonator XTAL through the capacitor CX3.

The oscillation frequency of the resonator XTAL has temperature characteristics (e.g., temperature characteristics in FIGS. 5A and 5B), which are compensated for by the output voltage VQ (frequency control voltage) of the D/A conversion unit 80. That is, the output voltage VQ is input to the variable capacitance capacitor CX1, and the capacitance value of the variable capacitance capacitor CX1 is controlled by the output voltage VQ. Since a change in the capacitance value of the variable capacitance capacitor CX1 changes the resonance frequency of an oscillation loop, the fluctuations in oscillation frequency caused by the temperature characteristics of the resonator XTAL are compensated for. The variable capacitance capacitor CX1 is realized by, for example, a variable capacitance diode (varactor) or the like.

The oscillation circuit 150 of the embodiment is not limited to the configuration in FIG. 8, and various modifications can be implemented. For example, an example in which CX1 is a variable capacitance capacitor in FIG. 8 has been described; however, CX2 or CX3 may be a variable capacitance capacitor that is controlled by the output voltage VQ. Moreover, more than one of CX1 to CX3 may be variable capacitance capacitors that are controlled by VQ.

6. Frequency Drift

An improvement in frequency accuracy and a reduction in power consumption are required in a TCXO as a temperature compensated oscillator. For example, in a wearable apparatus such as a GPS-equipped watch or a measuring apparatus for biological information such as a pulse wave, an operation duration thereof using a battery needs to be lengthened. For this reason, a more reduction in power consumption is required in the TCXO serving as a reference signal source, while ensuring frequency accuracy.

Moreover, various systems are proposed as a communication system between a communication terminal and a base station. For example, in the time division duplex (TDD) system, each apparatus transmits data in an assigned time slot. A guard time is set between time slots (uplink slot and downlink slot), so that the overlapping of the time slots is prevented. In a next-generation communication system, it is proposed to perform data communication in the TDD system using, for example, one frequency band (e.g., 50 GHz).

However, when the TDD system described above is employed, each apparatus needs to perform time synchronization, and the counting of accurate absolute time is required. For realizing the requirement, it is conceivable, for example, to employ a method in which an atomic clock (atomic oscillator) is provided as a reference signal source in each apparatus; however, this method has a problem such as an increase in apparatus cost or an increase in apparatus size.

The TCXO includes an ATCXO, which is an analog temperature compensated oscillator, and a DTCXO, which is a digital temperature compensated oscillator.

Figure 9A:
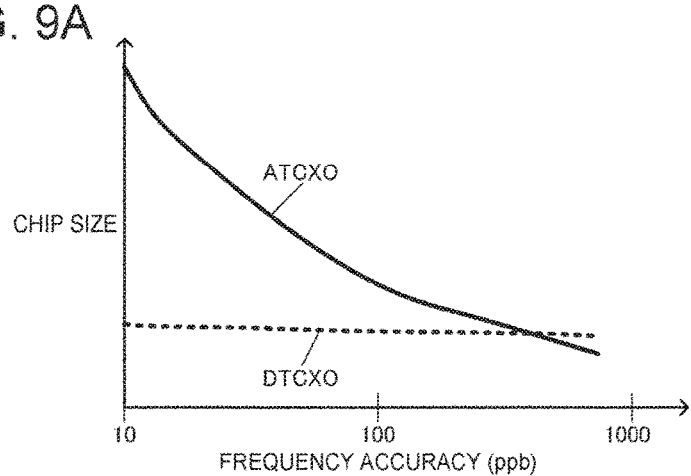
FIGS. 9A, 9B, and 9C are graphs for explaining the advantage and problem of a DTCXO.

When it is intended to increase the frequency accuracy in the case of using the ATCXO as a reference signal source, the chip size of the circuit device increases as shown in FIG. 9A, and thus it is difficult to reduce the cost or reduce the power consumption.

On the other hand, the DTCXO has an advantage in that the frequency accuracy can be increased without greatly increasing the chip size of the circuit device as shown in FIG. 9A.

However, the digital oscillator such as the DTCXO has a problem in that a communication error or the like occurs in a communication device into which the oscillator is incorporated because of the frequency drift of the oscillation frequency. For example, in the digital oscillator, the temperature detection voltage from the temperature sensor unit is A/D-converted, the temperature compensation process of frequency control data is performed based on the obtained temperature detection data, and an oscillation signal is generated based on the frequency control data. In this case, it has been revealed that a great change in the value of the frequency control data due to a temperature change causes the problem of frequency hopping. When the frequency hopping described above occurs, a problem such as the releasing of the lock of a GPS may occur in a GPS-related communication device for example.

For this reason, although various circuit systems are proposed for the digital oscillator such as the DTCXO, the digital oscillator is hardly employed as a reference signal source in an actual product where the communication error is problematic, and thus the analog oscillator such as the ATCXO is employed under present circumstances.

Figure 9B:
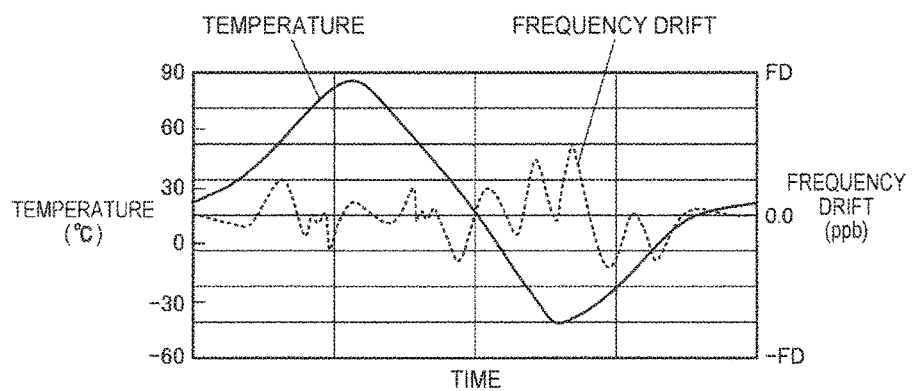

For example, FIG. 9B is a graph showing the frequency drift of the ATCXO. In the ATCXO, even when temperature changes with the lapse of time as shown in FIG. 9B, the frequency drift falls within the range (±FD) of an allowable frequency drift (allowable frequency error). In FIG. 9B, the frequency drift (frequency error) is represented by the ratio (frequency accuracy; ppb) thereof to a nominal oscillation frequency (e.g., approximately 16 MHz). For example, for preventing the occurrence of the communication error, the frequency drift needs to fall within the range (±FD) of the allowable frequency drift in a predetermined time period TP (e.g., 20 msec). The FD herein is, for example, approximately several ppb.

Figure 9C:
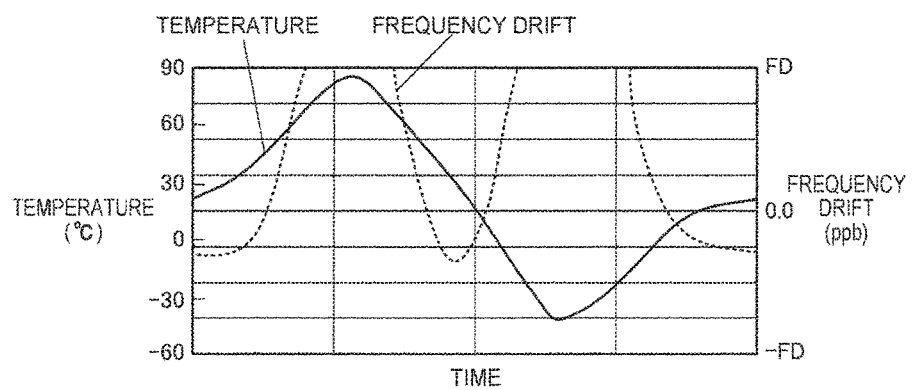

On the other hand, FIG. 9C is a graph showing the frequency drift in the case of using a related-art DTCXO. As shown in FIG. 9C, the frequency drift does not fall within the range of the allowable frequency drift in the related-art DTCXO, and the frequency hopping where the frequency exceeds the range occurs. For this reason, the communication error (lock releasing of a GPS, etc.) due to this frequency hopping occurs, which is obstructive to the employment of the DTCXO as a reference signal source in an actual product.

Figure 10:
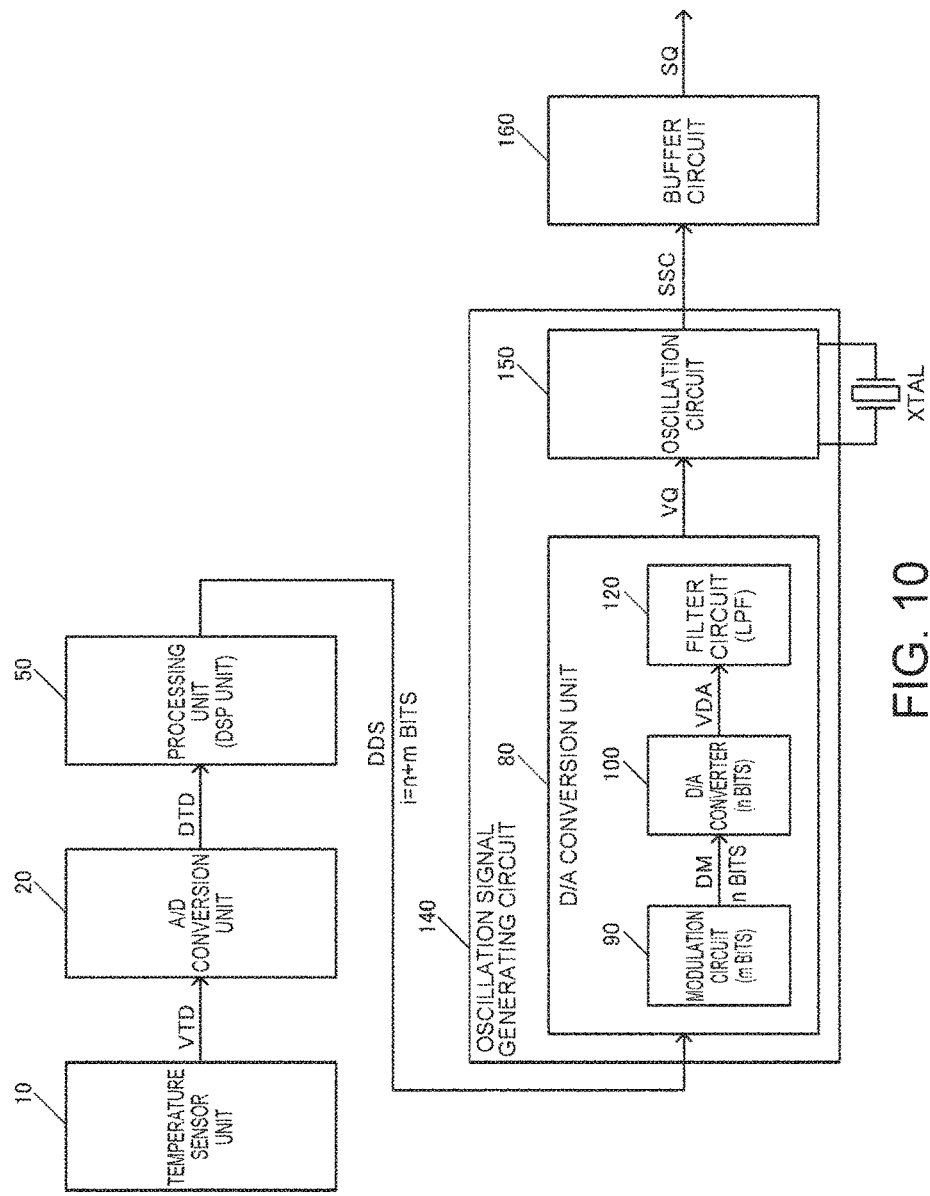
FIG. 10 shows a second detailed configuration example of the circuit device.

FIG. 10 shows a second detailed configuration example of the circuit device of the embodiment. In FIG. 10, the D/A conversion unit 80 includes the modulation circuit 90, the D/A converter 100, and the filter circuit 120.

The modulation circuit 90 of the D/A conversion unit 80 receives i=(n+m) bits of frequency control data DDS from the processing unit 50 (i, n, and m are integers of 1 or more). As one example, i=20, n=16, and m=4. Then, the modulation circuit 90 modulates n bits (e.g., 16 bits) of data of the frequency control data DDS based on m bits (e.g., 4 bits) of data of the frequency control data DDS. Specifically, the modulation circuit 90 performs PWM-modulation of the frequency control data DDS. The modulation method of the modulation circuit 90 is not limited to the PWM-modulation (pulse-width modulation), and may be, for example, pulse modulation such as PDM-modulation (pulse-density modulation) or a modulation method other than the pulse modulation. For example, bit extension (bit extension from n bits to i bits) may be realized by performing an m-bit dither process (dithering process) on n bits of data of the frequency control data DDS.

The D/A converter 100 performs D/A conversion of the n bits of data modulated by the modulation circuit 90. For example, the D/A converter 100 performs D/A conversion of n=16 bits of data. As the D/A conversion method of the D/A converter 100, for example, a resistor-string type or a resistor-ladder type can be employed.

The filter circuit 120 smooths an output voltage VDA of the D/A converter 100. For example, the filter circuit 120 performs a low-pass filter process to smooth the output voltage VDA. By providing the filter circuit 120, for example, PWM-demodulation of a PWM-modulated signal is possible. The cutoff frequency of the filter circuit 120 can be set according to the PWM-modulation frequency of the modulation circuit 90. That is, since the signal of the output voltage VDA from the D/A converter 100 contains the fundamental frequency of PWM-modulation and the ripple of a harmonic component, this ripple is attenuated by the filter circuit 120. As the filter circuit 120, for example, a passive filter using a passive element such as a resistor or a capacitor can be employed. However, an active filter such as an SCF can also be used as the filter circuit 120.

The resolution of the D/A conversion unit 80 needs to be as high as possible for inhibiting the occurrence of the communication error due to the frequency hopping described with reference to FIG. 9C and improving the frequency accuracy.

However, it is difficult to realize D/A conversion with resolution, for example, as high as i=20 bits only with the D/A converter 100 of, for example, resistor-string type or the like. Moreover, when the output noise of the D/A conversion unit 80 is large, the noise makes it difficult to improve the frequency accuracy.

In FIG. 10, therefore, the modulation circuit 90 is provided in the D/A conversion unit 80. Moreover, the processing unit 50 outputs i=m+n bits of frequency control data DDS whose number of bits is larger than n bits (e.g., 16 bits) as the resolution of the D/A converter 100. The processing unit 50 performs floating-point operations or the like for realizing, for example, digital signal processing such as a temperature compensation process, and therefore, it is easy to output the i=m+n bits of frequency control data DDS whose number of bits is larger than n bits (e.g., n=16 bits).

The modulation circuit 90 performs modulation (PWM-modulation, etc.) of n bits of data of i=m+n bits of data based on m bits of data of the i=m+n bits of data, and outputs n bits of modulated data DM to the D/A converter 100. Then, the D/A converter 100 performs D/A conversion of the data DM, and the filter circuit 120 performs a smoothing process of the obtained output voltage VDA, so that D/A conversion with resolution as high as i=m+n bits (e.g., 20 bits) can be realized.

According to this configuration, for example, a resistor-string type or the like with less output noise can be employed as the D/A converter 100. Therefore, the output noise of the D/A conversion unit 80 can be reduced, and the degradation of the frequency accuracy is easily inhibited. For example, although modulation in the modulation circuit 90 causes noise, the noise can be sufficiently attenuated by setting the cutoff frequency of the filter circuit 120, and thus the degradation of the frequency accuracy due to the noise can be inhibited.

The resolution of the D/A conversion unit 80 is not limited to i=20 bits. The resolution may be higher or lower than 20 bits. Moreover, the number of modulation bits in the modulation circuit 90 is not limited to m=4 bits. The number of modulation bits may be larger than 4 bits (e.g., m=8 bits) or smaller than 4 bits.

Moreover, in FIG. 10, the provision of the processing unit 50 performing digital signal processing such as a temperature compensation process at the front stage of the D/A conversion unit 80 is effectively used. That is, the processing unit 50 executes digital signal processing such as a temperature compensation process with high accuracy through, for example, floating-point operations or the like. Accordingly, if, for example, low-order bits of the mantissa portion of the floating-point operation result are also used as effective data and converted to binary data, the frequency control data DDS with, for example, a number of bits as high as i=m+n=20 bits can be easily output. This is focused on in FIG. 10; the i=m+n bits of frequency control data DDS, which is such a high number of bits of data, is supplied to the D/A conversion unit 80, and D/A conversion with resolution as high as i=m+n bits is successfully realized using the modulation circuit 90 with m bits and the D/A converter 100 with n bits.

By increasing the resolution of the D/A conversion unit 80 as described above, the occurrence of the frequency hopping described above can be inhibited. With this configuration, it is possible to inhibit the occurrence of a communication error or the like due to the frequency hopping.

In addition to the problem of the frequency hopping described above, very high frequency accuracy is required for the oscillation frequency in the digital oscillator such as the DTCXO or the OCXO. For example, in the TDD system described above, data is transmitted or received in a time-division manner using the same frequency in both uplink and downlink, and a guard time is set between the time slots assigned to the apparatuses. For this reason, time synchronization needs to be performed in each of the apparatuses for realizing a proper communication, and the counting of accurate absolute time is required. For example, in the case of the occurrence of hold-over where a reference signal (a GPS signal, or a signal through the Internet) is lost or abnormal, the oscillator needs to accurately count absolute time under the absence of the reference signal. For this reason, very high oscillation frequency accuracy is required in the oscillator used for the apparatuses (a GPS-related apparatus, a base station, etc.).

If a method in which an atomic clock or the like is provided in each apparatus is employed for realizing the requirement, the method leads to an increase in apparatus cost or an increase in apparatus scale. Moreover, even if an oscillator with high frequency accuracy is realized, it is undesirable that the scale of the circuit device used in the oscillator is increased or the power consumption is greatly increased.

In this regard, according to the configuration of the circuit device in FIG. 10, the D/A conversion unit 80 with, for example, resolution as so high as $i \geq 20$ bits can be realized by simply providing the modulation circuit 90 or the filter circuit 120 in the D/A conversion unit 80, so that higher accuracy of the oscillation frequency can be realized with the increased resolution. In addition, the chip size or power consumption of the circuit device is not greatly increased by the provision of the modulation circuit 90 or the filter circuit 120. Further, since the processing unit 50 executes a temperature compensation process through floating-point operations or the like, it is easy to output the frequency control data DDS with, for example, $i \geq 20$ bits to the D/A conversion unit 80. Accordingly, the configuration of the circuit device in FIG. 10 has an advantage in that both the higher accuracy of the oscillation frequency and the inhibition of an increase in the scale or power consumption of the circuit device can be realized.

The circuit device in FIG. 10 can also be used as an oscillating IC in a PLL circuit including a phase-comparison circuit that compares the reference signal (a GPS signal, or a signal through the Internet) with an input signal based on an oscillation signal. In this case, the processing unit 50 performs a temperature compensation process, an aging correction process, or the like on, for example, frequency control data from the phase-comparison circuit, and the oscillation signal generating circuit 140 generates an oscillation signal.

Figure 11:
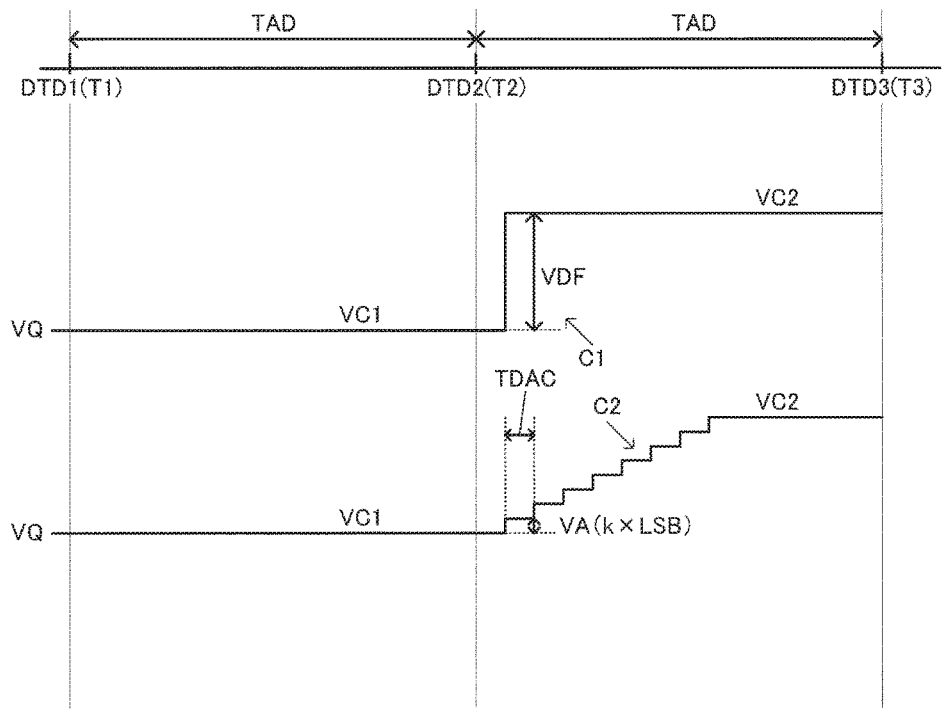
FIG. 11 shows a diagram for explaining a method of an embodiment.

Moreover, as shown in FIG. 11, the embodiment is configured such that when the temperature changes from a first temperature T1 to a second temperature T2, the output voltage VQ that changes in a voltage width smaller than the absolute value of a difference voltage VDF between a first control voltage VC1 and a second control voltage VC2 is output from the D/A conversion unit 80 to the oscillation circuit 150.

The absolute value of the difference voltage VDF is, for example, |VC1−VC2|, where VC1 may be greater than VC2 or VC1 may be smaller than VC2. Moreover, when VC1=VC2 (DTD1=DTD2) because of, for example, the absence of change in temperature, a change voltage width of the output voltage VQ is also, of course, 0 V. Therefore, the absolute value of the difference voltage VDF and the change voltage width of the output voltage VQ coincide with each other. That is, this case is an exceptional case of the method of the embodiment.

For example, in the case where the method of the embodiment is not employed, when the temperature changes from T1 to T2, the output voltage VQ of the D/A conversion unit 80 changes in the step width of the difference voltage VDF as indicated by C1 in FIG. 11.

In contrast to this, in the method of the embodiment, the output voltage VQ of the D/A conversion unit 80 changes in a voltage width VA smaller than the absolute value of the difference voltage VDF as indicated by C2 in FIG. 11. The voltage width VA represents a voltage change of the output voltage VQ in, for example, a time period TDAC.

As indicated by C2 in FIG. 11, when the output voltage VQ of the D/A conversion unit 80 is changed so as to satisfy VA<VDF, a change in the oscillation frequency of the oscillation circuit 150 is very small compared with the case of C1. Accordingly, the occurrence of the frequency hopping described with reference to FIG. 9C is inhibited, and thus the occurrence of a communication error can also be prevented.

More specifically, in the embodiment, the D/A conversion unit 80 outputs the output voltage VQ that changes in a step width of a voltage corresponding to k×LSB (k≥1) where LSB is the minimum resolution of data in D/A conversion. For example, as indicated by C2 in FIG. 11, the output voltage VQ of the D/A conversion unit 80 changes in a stepwise manner (stepwise) in the step width of the voltage corresponding to k×LSB. That is, the voltage width VA described above is a voltage width corresponding to the minimum resolution of the D/A conversion unit 80, and is, for example, the step width of the voltage corresponding to k×LSB of the D/A conversion unit 80. It is sufficient that the voltage width VA is smaller than or equal to the step width of the voltage corresponding to k×LSB. The voltage width VA may be set smaller than the step width of the voltage corresponding to k×LSB using, for example, a method of a modified example described later.

Herein, LSB is the minimum resolution of data (the frequency control data DDS output by the processing unit 50) input to the D/A conversion unit 80. The voltage corresponding to LSB is a minimum resolution voltage that is a voltage per minimum resolution in D/A conversion. Accordingly, the voltage corresponding to k×LSB corresponds to a voltage that is k times the minimum resolution voltage.

For example, when the resolution of the D/A conversion unit 80 is i bits, $k < 2^i$, where k is an integer sufficiently smaller than $2^i$ (e.g., k=1 to 8). More specifically, when the resolution of the D/A conversion unit 80 is extended from n bits to i=n+m bits by providing the modulation circuit 90 for example, k can be set smaller than $2^m$.

For example, when k=1, the output voltage VQ of the D/A conversion unit 80 changes in a step width of a voltage corresponding to 1LSB (1 bit). For example, the output voltage VQ of the D/A conversion unit 80 changes (increases or decreases) in a stepwise manner (stepwise) in the step width of the voltage corresponding to 1LSB.

That is, the output voltage VQ of the D/A conversion unit 80 changes in the step width of the voltage corresponding to 1LSB (k×LSB in a broad sense) without depending on input data (the frequency control data DDS) to the D/A conversion unit 80. This can be realized such that, for example, the processing unit 50 in FIG. 10 outputs, when the temperature changes from the first temperature to the second temperature, the frequency control data DDS that changes from first data corresponding to the first temperature to second data corresponding to the second temperature in 1LSB units (k×LSB units).

The stepwise change in the voltage corresponding to the step width of k×LSB as indicated by C2 in FIG. 11 is realized such that the processing unit 50 outputs the frequency control data DDS (the D/A conversion unit 80 performs D/A conversion) at an output rate higher than an output rate of the temperature detection data DTD (DTD1, DTD2) from the A/D conversion unit 20.

For example, the A/D conversion unit 20 outputs the temperature detection data DID in every time period TAD as shown in FIG. 11. For example, the A/D conversion unit 20 outputs the first temperature detection data DTD1 corresponding to the first temperature T1, and then outputs the second temperature detection data DTD2 corresponding to the second temperature T2 after the lapse of the time period TAD. The time period TAD corresponds to an A/D conversion interval (the sampling interval of the temperature detection voltage) of the A/D conversion unit 20, and 1/TAD corresponds to the output rate of the A/D conversion unit 20.

When the A/D conversion unit 20 outputs the second temperature detection data DTD2, the processing unit 50 receives the second temperature detection data DTD2, performs digital signal processing such as a temperature compensation process, and then outputs the frequency control data DDS corresponding to the second temperature detection data DTD2. At this time, the processing unit 50 changes the frequency control data DDS in a stepwise manner in k×LSB units. Accordingly, the output voltage VQ of the D/A conversion unit 80 receiving the frequency control data DDS that changes in k×LSB units and performing D/A conversion also changes in the step width of the voltage corresponding to k×LSB in every time period TDAC as indicated by C2 in FIG. 11.

Herein, the time period TDAC corresponds to a D/A conversion interval (the output interval of the frequency control data DDS of the processing unit 50) of the D/A conversion unit 80, and 1/TDAC corresponds to the output rate of the processing unit 50 or the D/A conversion unit 80.

As shown in FIG. 11, TAD>TDAC, so that 1/TDAC, which is the output rate of the processing unit 50 or the D/A conversion unit 80, is high compared with 1/TAD, which is the output rate of the A/D conversion unit 20. Accordingly, even if the change width of the output voltage VQ in every time period TDAC (every output rate 1/TDAC) is a small voltage width such as the voltage width VA=k×LSB, the output voltage VQ can change from the control voltage VC1 to the control voltage VC2 in the time period TAD. That is, when the temperature changes from T1 to T2 and the temperature detection data changes from DTD1 to DTD2, the output voltage VQ can be changed from the control voltage VC1 corresponding to the temperature detection data DTD1 to the control voltage VC2 corresponding to the temperature detection data DTD2 in the time period TAD as the A/D conversion interval. The voltage width VA of the voltage change in this case is small, and therefore, it is also possible to inhibit the occurrence of the frequency hopping.

Figure 12A:
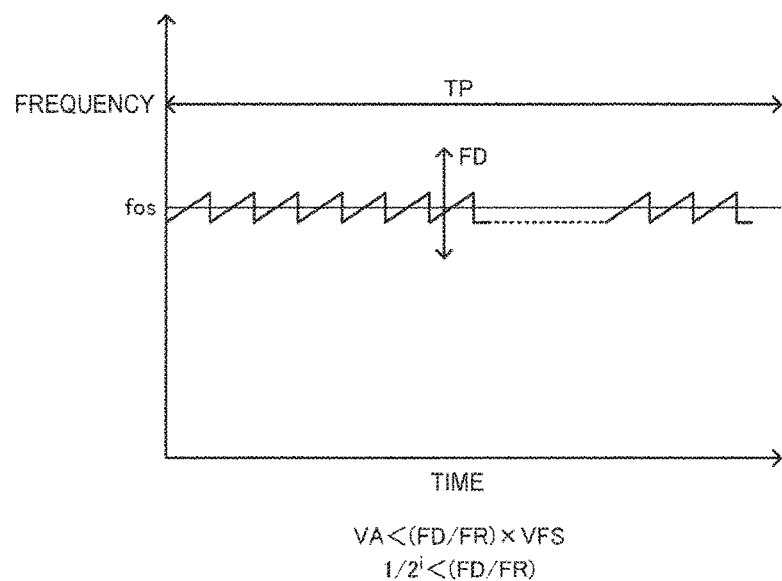
FIGS. 12A and 12B are graphs for explaining the method of the embodiment.
Figure 12B:
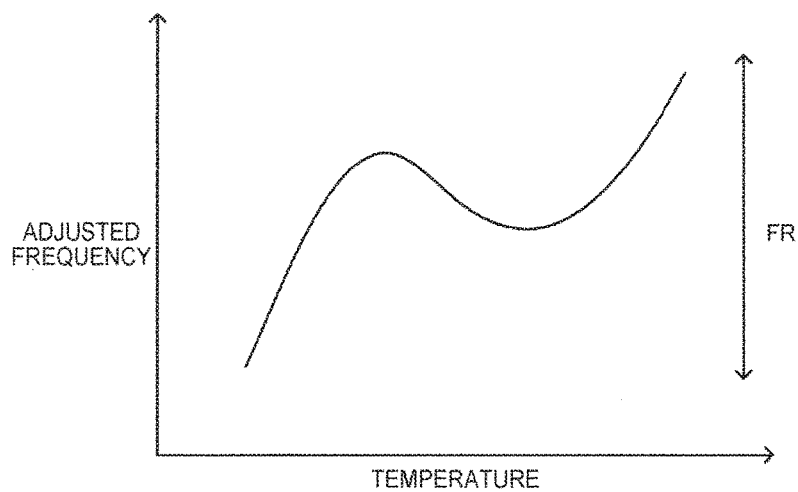

FIG. 12A is a graph for explaining the method of the embodiment in a frequency domain. For example, a frequency variable range of the oscillation frequency caused by the oscillation signal generating circuit 140 (the D/A conversion unit 80 and the oscillation circuit 150) is defined as FR. For example, the oscillation signal generating circuit 140 performs frequency adjustment such as shown in FIG. 12B for a temperature change, and FR is a frequency variable range in the frequency adjustment. That is, if the temperature change falls within the frequency variable range FR, the frequency adjustment by the oscillation signal generating circuit 140 can be made.

An allowable frequency drift of the oscillation frequency in the predetermined time period TP is defined as FD. For example, when the circuit device of the embodiment is used for communications in a global positioning system (GPS), a frequency drift of the oscillation frequency in the predetermined time period TP needs to fall within the allowable frequency drift FD for preventing the occurrence of a communication error in the GPS. If the frequency drift of the oscillation frequency does not fall within the allowable frequency drift FD due to the frequency hopping such as shown in FIG. 9C, erroneous determination occurs in, for example, a demodulation process for a received signal such as a GPS satellite signal and causes a communication error.

The full-scale voltage of the D/A conversion unit 80 is defined as VFS. The D/A conversion unit 80 can change the output voltage VQ within the range of the full-scale voltage VFS. The full-scale voltage VFS corresponds to a voltage range obtained when, for example, the frequency control data DDS input to the D/A conversion unit 80 changes in a full range such as from 0 to $2^i$.

The voltage width of a voltage change of the output voltage VQ in the D/A conversion interval of the D/A conversion unit 80 is defined as VA. In the method of the embodiment in this case, the following expression (1) is established as shown in FIG. 12A.

$$VA<(FD/FR)\times VFS \tag{1}$$

Specifically, when the resolution of the D/A conversion unit 80 is i bits, the following expression (2) is established.

$$\tfrac{1}{2}^i<(FD/FR) \tag{2}$$

By employing the method of the embodiment shown in the expressions (1) and (2), the frequency drift of the oscillation frequency with respect to a nominal oscillation frequency fos (e.g., approximately 16 MHz) in the predetermined time period TP (e.g., 20 msec) can fall within the allowable frequency drift FD (e.g., approximately several ppb) as shown in FIG. 12A. With this configuration, it is possible to inhibit the occurrence of the communication error or the like due to the frequency hopping described with reference to FIG. 9C and the like.

For example, (FD/FR)×VFS on the right side of the expression (1) is obtained by multiplying the full-scale voltage VFS of the D/A conversion unit 80 by (FD/FR), which is the ratio of the allowable frequency drift FD to the frequency variable range FR.

When the voltage width VA of a change in the output voltage VQ in the D/A conversion interval of the D/A conversion unit 80 is set smaller than (FD/FR)×VFS, the frequency drift with respect to the nominal oscillation frequency fos can fall within the allowable frequency drift FD in the frequency domain as shown in FIG. 12A. That is, the voltage width VA of a change in the output voltage VQ of the D/A conversion unit 80 can be made small, and thus the occurrence of the frequency hopping can be inhibited.

For example, if the expression (1) is not established, the frequency hopping where the frequency drift with respect to the nominal oscillation frequency fos does not fall within the allowable frequency drift FD occurs and thus causes a communication error or the like in the GPS. By changing the output voltage VQ of the D/A conversion unit 80 so that the expression (1) is established in the embodiment, the occurrence of the frequency hopping is inhibited, and thus the communication error or the like can be prevented.

That is, the D/A conversion unit 80 changes the output voltage VQ within the range of the full-scale voltage VFS to adjust the oscillation frequency of the oscillation circuit 150 in the frequency variable range FR as shown in FIG. 12B, so that the temperature compensation process of the oscillation frequency is realized.

However, when the voltage width VA of a change in the output voltage VQ of the D/A conversion unit 80 increases and, for example, VA≥(FD/FR)×VFS is established, the frequency drift of the oscillation frequency exceeds the allowable frequency drift FD and thus causes the frequency hopping.

In contrast to this, the output voltage VQ of the D/A conversion unit 80 is changed in the voltage width VA, which is small so that the relation: VA<(FD/FR)×VFS is established, in the embodiment, and therefore, the occurrence of the frequency hopping can be inhibited.

When the resolution of the D/A conversion unit 80 is i bits, $\frac{1}{2}^i$<(FD/FR) is established in the embodiment as in the expression (2).

For example, multiplying the both sides of the expression (2) by the full-scale voltage VFS of the D/A conversion unit 80 results in the following expression (3).

$$VFS \times \tfrac{1}{2}^i < (FD/FR) \times VFS \qquad (3)$$

VFS×$\frac{1}{2}^i$ on the left side of the expression (3) corresponds to 1LSB voltage (minimum resolution voltage) of the D/A conversion unit 80. The expressions (2) and (3) mean that VFS×$\frac{1}{2}^i$ corresponding to the 1LSB voltage is set smaller than (FD/FR)×VFS. If VFS×$\frac{1}{2}^i$<(FD/FR)×VFS, the frequency drift of the oscillation frequency does not exceed the allowable frequency drift FD when the output voltage VQ of the D/A conversion unit 80 changes in the step width of the 1LSB voltage, and thus the occurrence of the frequency hopping can be inhibited.

In other words, i bits as the resolution of the D/A conversion unit 80 are set such that the expressions (2) and (3) are established.

In this case, for ensuring a sufficient margin in consideration of various variations such as variation in manufacture, it is desirable to set the resolution of the D/A conversion unit 80 such that $\frac{1}{2}^i$ is sufficiently small compared with (FD/FR). Specifically, the resolution of the D/A conversion unit 80 is set, for example, greater than or equal to i=20 bits.

By doing this, even when, for example, the allowable frequency drift in the predetermined time period TP is, for example, approximately several ppb, the expressions (2) and (3) are established with a margin. Accordingly, the occurrence of the communication error or the like due to the frequency hopping can be effectively inhibited.

7. D/A Conversion Unit

Figure 13:
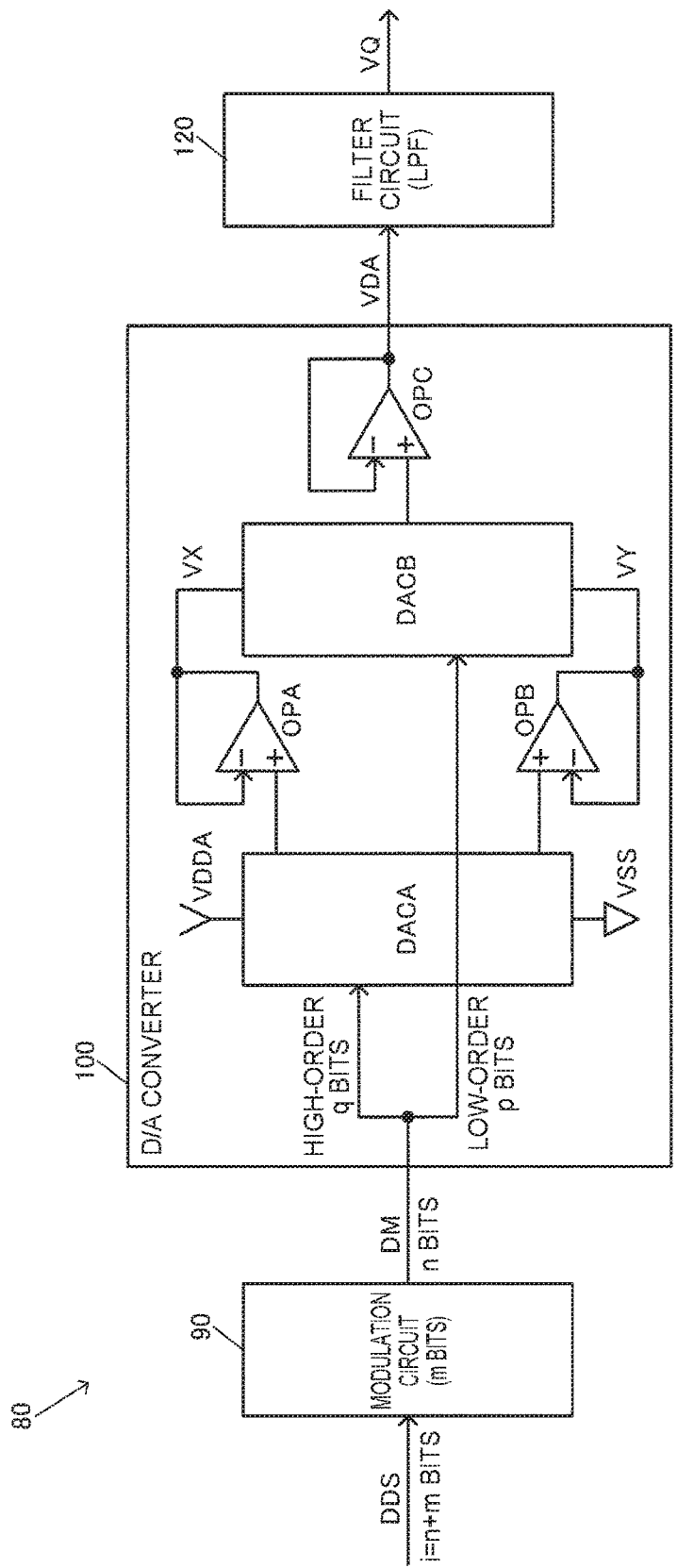
FIG. 13 shows a detailed configuration example of a D/A conversion unit.

FIG. 13 shows a detailed configuration example of the D/A conversion unit 80. The D/A conversion unit 80 includes the modulation circuit 90, the D/A converter 100, and the filter circuit 120.

The D/A converter 100 includes a D/A converter DACA on the high-order side, a D/A converter DACB on the low-order side, and operational amplifiers OPA, OPB, and OPC connected in a voltage follower manner.

High-order q bits of data of n bits (n=q+p) of data DM from the modulation circuit 90 are input to the D/A converter DACA on the high-order side, and low-order p bits (e.g., p=q=8) of data are input to the D/A converter DACB on the low-order side. The D/A converter DACA on the high-order side and the D/A converter DACB on the low-order side are each a resistor-string type D/A converter that selects a voltage corresponding to input data from, for example, a plurality of divided voltages divided by a plurality of resistors connected in series.

The D/A converter DACA on the high-order side includes a plurality of resistors connected in series between a node of the power supply voltage VRC (reference voltage) and a node of the voltage VSS. The D/A converter DACA on the high-order side outputs one of divided voltages at ends of a resistor that is specified by the high-order q bits of data in the plurality of resistors, to a non-inverting input terminal of the operational amplifier OPA, and outputs the other divided voltage to a non-inverting input terminal of the operational amplifier OPB. With this configuration, the one voltage is impedance-converted by the operational amplifier OPA connected in a voltage follower manner, and is supplied as a voltage VX to the D/A converter DACB on the low-order side. The other voltage is impedance-converted by the operational amplifier OPB connected in a voltage follower manner, and is supplied as a voltage VY to the D/A converter DACB on the low-order side.

The D/A converter DACB on the low-order side includes a plurality of resistors connected in series between a node of the voltage VX and a node of the voltage VY. The D/A converter DACB on the low-order side outputs, as a selected voltage, one divided voltage that is selected by the low-order p bits of data from a plurality of divided voltages divided by the plurality of resistors, to a non-inverting input terminal of the operational amplifier OPC connected in a voltage follower manner. With this configuration, the selected voltage is output as the output voltage VDA of the D/A converter 100.

8. Temperature Sensor Unit and Oscillation Circuit

Figure 14A:
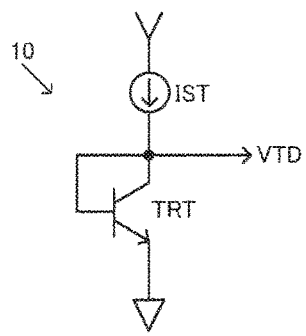
FIG. 14A shows a first configuration example of a temperature sensor unit.

FIG. 14A shows a first configuration example of the temperature sensor unit 10. The temperature sensor unit 10 in FIG. 14A includes a current source IST and a bipolar transistor TRT whose collector is supplied with a current from the current source IST. The bipolar transistor TRT is diode-connected with its collector connected to its base. The temperature detection voltage VTD having temperature characteristics is output to a node at the collector of the bipolar transistor TRT. The temperature characteristics of the temperature detection voltage VTD are caused due to the temperature dependence of a base-emitter voltage of the bipolar transistor TRT. As shown in FIG. 14C, the temperature detection voltage VTD has negative temperature characteristics (linear temperature characteristics with a negative gradient).

Figure 14B:
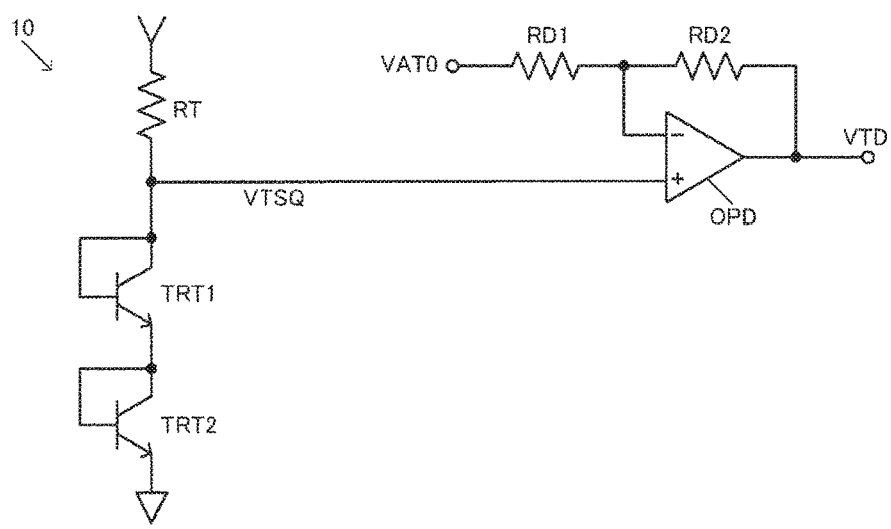
FIG. 14B shows a second configuration example of the temperature sensor unit.
Figure 14C:
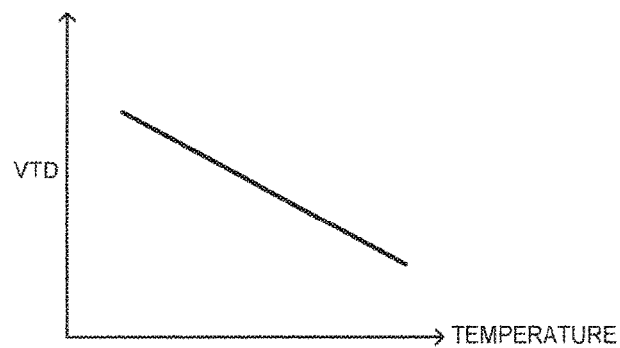
FIG. 14C shows an example of the temperature characteristics of the temperature sensor unit.

FIG. 14B shows a second configuration example of the temperature sensor unit 10. In FIG. 14B, the current source IST in FIG. 14A is realized by a resistor RT. One end of the resistor RT is connected to the node of the power supply voltage, and the other end is connected to a collector of a bipolar transistor TRT1. An emitter of the bipolar transistor TRT1 is connected to a collector of a bipolar transistor TRT2. The bipolar transistors TRT1 and TRT2 are each diode-connected. A voltage VTSQ that is output to a node at the collector of the bipolar transistor TRT1 has negative temperature characteristics (linear temperature characteristics with a negative gradient) as shown in FIG. 14C.

Moreover, the temperature sensor unit 10 in FIG. 14B is further provided with an operational amplifier OPD and resistors RD1 and RD2. The voltage VTSQ is input to a non-inverting input terminal of the operational amplifier OPD, and one end of the resistor RD1 and one end of the resistor RD2 are connected to the inverting input terminal. A reference temperature voltage VAT0 is supplied to the other end of the resistor RD1, and the other end of the resistor RD2 is connected to an output terminal of the operational amplifier OPD.

The operational amplifier OPD and the resistors RD1 and RD2 constitute an amplifier that non-invertingly amplifies the voltage VTSQ using the reference temperature voltage VAT0 as a reference. With this configuration, the temperature detection voltage VTD=VAT0+(1+RD2/RD1)×(VTSQ−VAT0) is output from the temperature sensor unit 10. Then, a reference temperature T0 can be adjusted by adjusting the reference temperature voltage VAT0.

9. A/D Conversion Unit

Figure 15:
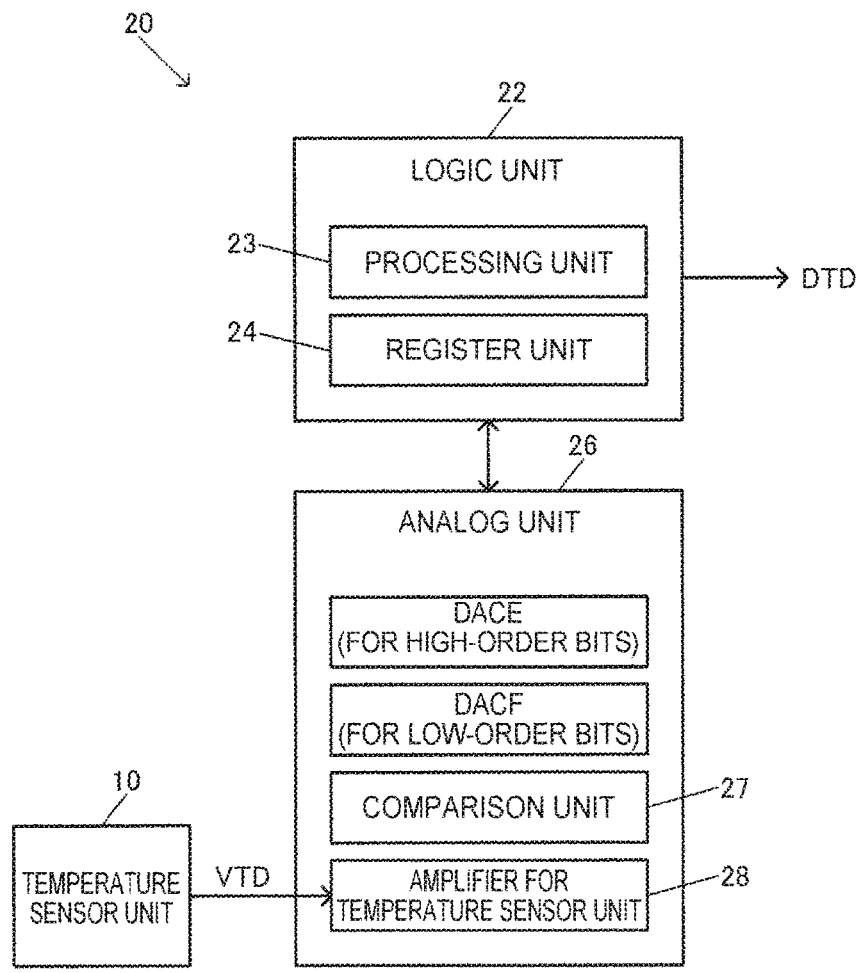
FIG. 15 shows a detailed configuration example of an A/D conversion unit.

FIG. 15 shows a detailed configuration example of the A/D conversion unit 20. The A/D conversion unit 20 includes a processing unit 23, a register unit 24, D/A converters DACE and DACF, and a comparison unit 27. Moreover, the A/D conversion unit 20 can further include an amplifier 28 for the temperature sensor unit. The processing unit 23 and the register unit 24 are provided as the logic unit 22. The D/A converters DACE and DACF, the comparison unit 27, and the amplifier 28 for the temperature sensor unit are provided as the analog unit 26.

The register unit 24 stores result data such as the intermediate result or final result of A/D conversion. The register unit 24 corresponds to, for example, a successive approximation result register in a successive approximation method. The D/A converters DACE and DACF D/A-convert the result data in the register unit 24. As each of these DACE and DACF, a D/A converter having the configuration similar to that of FIG. 13 can be employed. The comparison unit 27 compares the output voltage of the D/A converters DACE and DACF with the temperature detection voltage VTD (a voltage after being amplified by the amplifier 28 for the temperature sensor unit). The comparison unit 27 can be realized by, for example, a chopper-type comparator or the like. The processing unit 23 performs a determination process based on the comparison result of the comparison unit 27, and performs an update process of the result data in the register unit 24. Then, the final temperature detection data DTD obtained by the update process is output from the A/D conversion unit 20 as the A/D conversion result of the temperature detection voltage VTD. With the configuration described above, for example, A/D conversion by the successive approximation method or A/D conversion by a method similar to the successive approximation method can be realized.

10. Oscillator, Electronic Apparatus, and Moving Object

Figure 16A:
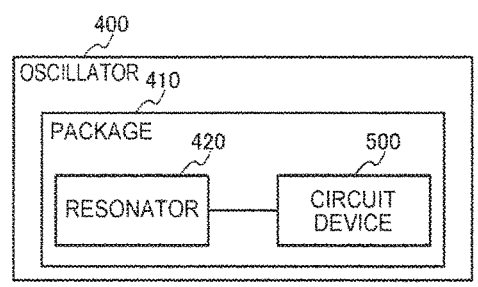
FIG. 16A shows a configuration example of an oscillator.

FIG. 16A shows a configuration example of an oscillator 400 including a circuit device 500 of the embodiment. As shown in FIG. 16A, the oscillator 400 includes a resonator 420 and the circuit device 500. The resonator 420 and the circuit device 500 are housed in a package 410 of the oscillator 400. Terminals of the resonator 420 and terminals (pads) of the circuit device 500 (IC) are electrically connected by means of internal wiring lines of the package 410.

Figure 16B:
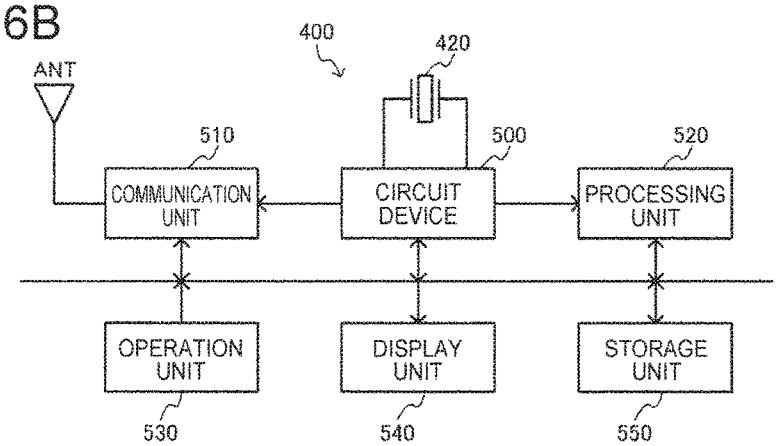
FIG. 16B shows a configuration example of an electronic apparatus.

FIG. 16B shows a configuration example of an electronic apparatus including the circuit device 500 of the embodiment. The electronic apparatus includes the circuit device 500 of the embodiment, the resonator 420 such as a quartz crystal resonator, an antenna ANT, a communication unit 510, and a processing unit 520. Moreover, the electronic apparatus can include an operation unit 530, a display unit 540, and a storage unit 550. The resonator 420 and the circuit device 500 constitute the oscillator 400. The electronic apparatus is not limited to the configuration in FIG. 16B. Various modifications can be implemented, such as omitting a portion of the components or adding another component.

Examples of the electronic apparatus in FIG. 16B conceivably include various apparatuses, for example, a wearable apparatus such as a GPS-equipped watch, a biological information measuring apparatus (a sphygmograph, a pedometer, etc.) or a head-mounted display device, a personal digital assistant (mobile terminal) such as a smartphone, a mobile phone, a portable game console, a notebook PC or a tablet PC, a content providing terminal that distributes contents, a video apparatus such as a digital camera or a video camcorder, and a network-related apparatus such as a base station or a router.

The communication unit 510 (radio circuit) performs a process for receiving data from the outside through the antenna ANT or transmitting data to the outside. The processing unit 520 performs a control process for the electronic apparatus or various kinds of digital processing of the data transmitted or received through the communication unit 510. The function of the processing unit 520 can be realized by, for example, a processor such as a microcomputer.

The operation unit 530 is used by the user to perform input operations, and can be realized by operation buttons, a touch panel display, or the like. The display unit 540 displays various kinds of information, and can be realized by a liquid crystal display, an organic EL display, or the like. When a touch panel display is used as the operation unit 530, the touch panel display also functions as the operation unit 530 and the display unit 540. The storage unit 550 stores data, and the function thereof can be realized by a semiconductor memory such as a RAM or a ROM, a hard disk drive (HDD), or the like.

Figure 16C:
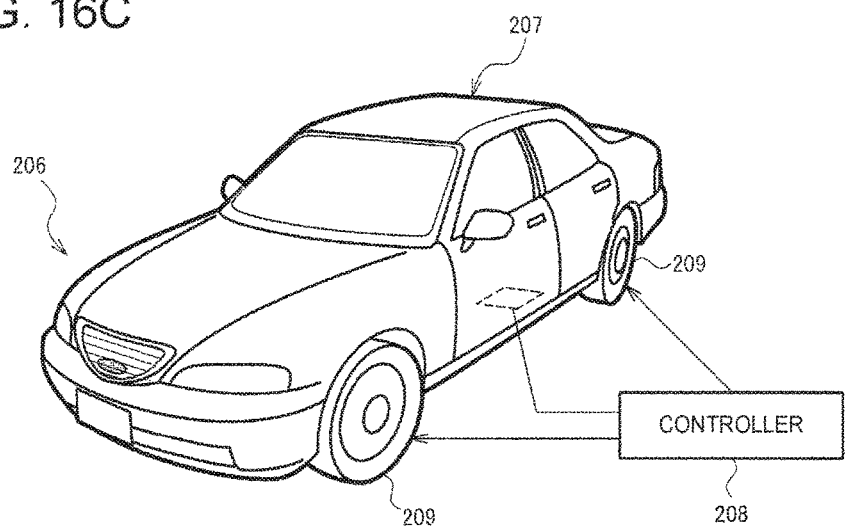
FIG. 16C shows an example of a moving object.

FIG. 16C shows an example of a moving object including the circuit device of the embodiment. The circuit device (oscillator) of the embodiment can be incorporated into various moving objects such as, for example, a vehicle, an airplane, a motorcycle, a bicycle, and a ship. The moving object is an apparatus or device that includes, for example, a drive mechanism such as an engine or a motor, a steering mechanism such as a steering wheel or handlebars, and various types of electronic apparatuses (vehicle-mounted apparatuses) and moves on the ground, in the air, or at sea. FIG. 16C schematically shows an automobile 206 as a specific example of the moving object. The oscillator (not shown) including the circuit device of the embodiment and the resonator is incorporated into the automobile 206. A controller 208 operates with a clock signal generated by the oscillator. The controller 208 controls, for example, the hardness and softness of a suspension in response to the posture of a vehicle body 207, or controls brakes of individual wheels 209. For example, the controller 208 may realize automatic driving of the automobile 206. The apparatus into which the circuit device or oscillator of the embodiment is incorporated is not limited to the controller 208, and the circuit device or oscillator of the embodiment can be incorporated into various types of apparatuses (vehicle-mounted apparatuses) provided in the moving object such as the automobile 206.

While the embodiment has been described above in detail, those skilled in the art should readily understand that many modifications can be made without substantially departing from the novel matter and effects of the invention. Accordingly, all of those modified examples are deemed to be included in the scope of the invention. For example, the terms mentioned in the specification or the drawings at least once together with different terms in a broader sense or a similar sense may be replaced with the different terms in any part of the specification or the drawings. Moreover, all of the combinations of the embodiment and the modified examples are included in the scope of the invention. Moreover, the configurations, operations, and the like of the circuit device, the oscillator, the electronic apparatus, and the moving object are not limited to those described in the embodiment, and various modifications can be implemented.

The entire disclosure of Japanese Patent Application No. 2015-221730, filed Nov. 12, 2015 is expressly incorporated by reference herein.

What is claimed is:
1. A circuit device comprising:
an A/D conversion unit that performs A/D conversion of a temperature detection voltage from a temperature sensor unit and outputs temperature detection data;

a processing unit that performs a temperature compensation process of an oscillation frequency based on the temperature detection data and outputs frequency control data of the oscillation frequency;
an oscillation signal generating circuit that generates, using the frequency control data from the processing unit and a resonator, an oscillation signal at the oscillation frequency set by the frequency control data, wherein
the oscillation signal generating circuit includes
a D/A conversion unit that performs D/A conversion of the frequency control data from the processing unit, and
an oscillation circuit that generates the oscillation signal using an output voltage of the D/A conversion unit and the resonator, and
wherein, in a plan view of a substrate comprising the A/D conversion unit, the D/A conversion unit, the processing unit, and the oscillation circuit:
the D/A conversion unit is disposed on a first side of the A/D conversion unit,
the processing unit is disposed on a second side of the A/D conversion unit and the D/A conversion unit, the second side being perpendicular to the first side, and
the oscillation circuit is disposed on a third side or the first side of the D/A conversion unit, the third side being opposite to the second side;
a first reference voltage generating circuit that is electrically coupled to a first power supply terminal and supplies a first reference voltage to the processing unit;
a second reference voltage generating circuit that is electrically coupled to the first power supply terminal and generates a second reference voltage; and
a reference current generating circuit that generates a reference current based on the second reference voltage,
wherein the oscillation circuit causes the resonator to oscillate with a drive current based on the reference current.

2. The circuit device according to claim 1, further comprising a memory unit that stores coefficient data of an approximate Nth-order function of the temperature compensation process and supplies the coefficient data to the processing unit, wherein
the memory unit is disposed on the second side of the processing unit.

3. The circuit device according to claim 2, wherein
the processing unit and the memory unit are disposed such that long-side directions thereof are along the first side.

4. The circuit device according to claim 1, further comprising a buffer circuit that buffers the oscillation signal of the oscillation circuit, wherein
the oscillation circuit is disposed on the third side of the D/A conversion unit, and
the buffer circuit is disposed on a fourth side of the oscillation circuit, the fourth side being opposite to the first side.

5. The circuit device according to claim 1, further comprising a buffer circuit that buffers the oscillation signal of the oscillation circuit, wherein
the oscillation circuit is disposed on the first side of the D/A conversion unit, and
the buffer circuit is disposed on the second side of the oscillation circuit.

6. The circuit device according to claim 1, wherein
the oscillation circuit is disposed adjacent to the D/A conversion unit on the third side or the first side thereof.

7. The circuit device according to claim 2, wherein
the oscillation circuit is disposed adjacent to the D/A conversion unit on the third side or the first side thereof.

8. The circuit device according to claim 3, wherein
the oscillation circuit is disposed adjacent to the D/A conversion unit on the third side or the first side thereof.

9. The circuit device according to claim 1, wherein the first and second reference voltage generating circuits are supplied with an external power supply and generate the first and second reference voltages based on a work function difference of a transistor, wherein
the first and second reference voltage generating circuits are disposed in a pad area where a pad is disposed.

10. The circuit device according to claim 2, wherein the first and second reference voltage generating circuits are supplied with an external power supply and generate the first and second reference voltages based on a work function difference of a transistor, wherein
the first and second reference voltage generating circuits are disposed in a pad area where a pad is disposed.

11. The circuit device according to claim 3, wherein the first and second reference voltage generating circuits are supplied with an external power supply and generate the first and second reference voltages based on a work function difference of a transistor, wherein
the first and second reference voltage generating circuits are disposed in a pad area where a pad is disposed.

12. The circuit device according to claim 9, wherein
the first reference voltage generating circuit supplies the first reference voltage generated based on the work function difference as a first power supply voltage to the A/D conversion unit, and
the second reference voltage generating circuit supplies the second reference voltage generated based on the work function difference as a second power supply voltage to the processing unit,
the circuit device further comprising a third reference voltage generating circuit that supplies a third reference voltage generated based on the work function difference as a third power supply voltage to the D/A conversion unit.

13. The circuit device according to claim 1, further comprising:
an output terminal that outputs a signal based on the oscillation signal of the oscillation circuit;
a first terminal for the resonator and a second terminal for the resonator that are connected with the resonator,
wherein the first power supply terminal and the second power supply terminal are supplied with a power supply voltage; and
an enable terminal, wherein
the output terminal, the first terminal for the resonator, and the first power supply terminal are disposed in a first pad area along a first side of the circuit device,
the second power supply terminal, the second terminal for the resonator, and the enable terminal are disposed in a second pad area along a second side of the circuit device opposite to the first side, and
long-side directions of the first pad area and the second pad area correspond to the third side or the first side.

14. The circuit device according to claim 2, further comprising:
an output terminal that outputs a signal based on the oscillation signal of the oscillation circuit;

a first terminal for the resonator and a second terminal for the resonator that are connected with the resonator;

wherein the first power supply terminal and the second power supply terminal are supplied with a power supply voltage; and an enable terminal, wherein the output terminal, the first terminal for the resonator, and the first power supply terminal are disposed in a first pad area along a first side of the circuit device, the second power supply terminal, the second terminal for the resonator, and the enable terminal are disposed in a second pad area along a second side of the circuit device opposite to the first side, and long-side directions of the first pad area and the second pad area correspond to the third side or the first side.

15. The circuit device according to claim 3, further comprising:

an output terminal that outputs a signal based on the oscillation signal of the oscillation circuit;

a first terminal for the resonator and a second terminal for the resonator that are connected with the resonator;

wherein the first power supply terminal and the second power supply terminal are supplied with a power supply voltage; and an enable terminal, wherein the output terminal, the first terminal for the resonator, and the first power supply terminal are disposed in a first pad area along a first side of the circuit device, the second power supply terminal, the second terminal for the resonator, and the enable terminal are disposed in a second pad area along a second side of the circuit device opposite to the first side, and long-side directions of the first pad area and the second pad area correspond to the third side or the first side.

16. The circuit device according to claim 6, further comprising:

an output terminal that outputs a signal based on the oscillation signal of the oscillation circuit;

a first terminal for the resonator and a second terminal for the resonator that are connected with the resonator;

wherein the first power supply terminal and the second power supply terminal are supplied with a power supply voltage; and an enable terminal, wherein the output terminal, the first terminal for the resonator, and the first power supply terminal are disposed in a first pad area along a first side of the circuit device, the second power supply terminal, the second terminal for the resonator, and the enable terminal are disposed in a second pad area along a second side of the circuit device opposite to the first side, and long-side directions of the first pad area and the second pad area correspond to the third side or the first side.

17. An oscillator comprising:

the circuit device according to claim 1; and the resonator.

18. An electronic apparatus comprising the circuit device according to claim 1.

19. A moving object comprising the circuit device according to claim 1.

* * * * *